(12) United States Patent
Erbil et al.

(10) Patent No.: US 7,982,360 B2
(45) Date of Patent: *Jul. 19, 2011

(54) APPARATUS AND METHOD FOR FERROELECTRIC CONVERSION OF HEAT TO ELECTRICAL ENERGY

(75) Inventors: Ahmet Erbil, Atlanta, GA (US); David F. Walbert, Atlanta, GA (US)

(73) Assignee: The Neothermal Energy Company, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/887,793

(22) Filed: Sep. 22, 2010

(65) Prior Publication Data

US 2011/0001390 A1    Jan. 6, 2011

Related U.S. Application Data

(63) Continuation of application No. 12/465,924, filed on May 14, 2009.

(51) Int. Cl.
*H02N 11/00* (2006.01)
*H02N 1/00* (2006.01)
(52) U.S. Cl. ................. 310/306; 136/254; 250/338.2
(58) Field of Classification Search .......... 310/306–308; 322/2 A; 136/201, 254; 250/338.2
See application file for complete search history.

(56) References Cited

U.S. PATENT DOCUMENTS 3,073,974 A * 1/1963 Hoh Siegfried ............... 62/3.1
3,243,687 A * 3/1966 Hoh Siegfried ............ 322/2 R (Continued)

FOREIGN PATENT DOCUMENTS

EP    1145333 B1    10/2001

(Continued)

OTHER PUBLICATIONS

Olsen and Evans, "Pyroelectric Energy Conversion: Hysteresis loss and temperature sensitivity of a ferroelectric material", J. Appl. Phys. 54, Oct. 1983.*

(Continued)

*Primary Examiner* — Karl Tamai
(74) *Attorney, Agent, or Firm* — Tim Tingkang Xia; Morris, Manning & Martin, LLP

(57) ABSTRACT

The present invention relates to a new method and apparatus for converting heat to electric energy. The invention exploits the rapid changes in spontaneous polarization that occur in ferroelectric materials during phase change. The invention permits robust and economical generation of electric energy from thermal energy, and it can be used in many different applications. In one aspect, the present invention relates to an apparatus for converting heat to electric energy comprising a pair of electrodes; a ferroelectric layer formed there between with a ferroelectric material characterized with a Curie temperature, $T_c$, such that when the temperature of the ferroelectric material is lower than $T_c$, the ferroelectric material is in a ferroelectric phase in which very powerful polarization is established spontaneously in the unit cells of the ferroelectric material, and when the temperature of the ferroelectric material is greater than $T_c$, spontaneous polarization is not established in the unit cells of the ferroelectric material; and a means for alternately delivering a flow of cold fluid and a flow of hot fluid to the ferroelectric layer so as to alternately cool the ferroelectric layer at a first temperature $T_L$ that is lower than $T_c$, and heat the ferroelectric layer at a second temperature $T_H$ that is higher than $T_c$, thereby the ferroelectric material of the ferroelectric layer undergoes alternating phase transitions between the ferroelectric phase and the paraelectric phase with temperature cycling.

10 Claims, 29 Drawing Sheets

U.S. PATENT DOCUMENTS

| | | | |
|---|---|---|---|
| 3,824,448 A * | 7/1974 | De Rivas | 322/2 R |
| 4,220,906 A | 9/1980 | Drummond | |
| 4,425,540 A | 1/1984 | Olsen | |
| 4,647,836 A | 3/1987 | Olsen | |
| 4,983,839 A | 1/1991 | Deb | |
| 6,379,809 B1 | 4/2002 | Simpson et al. | |
| 6,528,898 B1 | 3/2003 | Ikura et al. | |
| 7,323,506 B2 | 1/2008 | Kouchachvili et al. | |
| 7,593,250 B2 | 9/2009 | Naumov et al. | |
| 7,768,050 B2 | 8/2010 | Rappe et al. | |
| 2003/0162394 A1 | 8/2003 | Takemura | |
| 2008/0074211 A1 | 3/2008 | Miles et al. | |
| 2008/0130346 A1 | 6/2008 | Naumov et al. | |
| 2008/0295879 A1 * | 12/2008 | Atanackovic | 136/238 |
| 2009/0010303 A1 | 1/2009 | Nagashima et al. | |
| 2010/0289377 A1 * | 11/2010 | Erbil et al. | 310/306 |
| 2011/0001390 A1 * | 1/2011 | Erbil et al. | 310/306 |

FOREIGN PATENT DOCUMENTS

| | | |
|---|---|---|
| GB | 1506587 A | 4/1978 |
| JP | 55012508 A | 1/1980 |
| JP | 63061125 A | 3/1988 |
| JP | 63233340 A | 9/1988 |
| WO | 9313564 A1 | 7/1993 |
| WO | 9965051 A2 | 12/1999 |
| WO | 00/36656 A1 | 6/2000 |
| WO | 2005011376 A2 | 2/2005 |
| WO | 2006058417 A1 | 6/2006 |
| WO | 2007140061 A3 | 12/2007 |
| WO | 2008088994 A2 | 7/2008 |
| WO | 2010061385 A1 | 6/2010 |

OTHER PUBLICATIONS

Kouchachvili and Ikura, "Pyroelectric Conversion- Effects of P(VDF-TrFE) preconditioning on Power Conversion" Journal of Electrostatics 65 (2007, no month provided) p. 182-188.*

Vanderpool, D., "Simulations of a Prototypical Device Using Pyroelectric Materials for Harvesting Waste Heat," Intl. J. of Heat & Mass Transfer, vol. 51, 2008, pp. 5052-5062, Jun. 2008.

Lines, M, "Principles and Applications of Ferroelectrics and Related Materials," Oxford University Press, Appendix F, pp. 621-633, 1977.

Tiffany, W., "Coherent Inc.: The Amazing Versatile Pyroelectric," pp. 1-3.

Olsen, R., "Cascaded Pyroelectric Energy Converter," Ferroelectrics, 1984, vol. 59, pp. 205-219, 1984.

* cited by examiner (a)

(b)

(a)

(b)

APPARATUS AND METHOD FOR FERROELECTRIC CONVERSION OF HEAT TO ELECTRICAL ENERGY

CROSS-REFERENCE TO RELATED PATENT APPLICATION

This application is a continuation application of a U.S. application Ser. No. 12/465,924, filed May 14, 2009, entitled "APPARATUS AND METHOD FOR FERROELECTRIC CONVERSION OF HEAT TO ELECTRICAL ENERGY," by Ahmet Erbil and David F. Walbert, which is incorporated herein by reference in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention generally relates to conversion of heat to electrical energy, and more particularly to apparatuses and methods that utilize spontaneous polarization of ferroelectric materials that occurs when they are in a temperature range corresponding to their ferroelectric phase, and disappears rapidly as the ferroelectric materials undergo a transition into their paraelectric or antiferroelectric phase as the temperature changes, to convert heat to electric energy.

BACKGROUND OF THE INVENTION

The use of capacitors with temperature dependent dielectric constants to convert heat to electric energy is well known. Representative devices that use dielectrics as variable capacitors to generate electricity are disclosed, for example, in U.S. Pat. No. 4,220,906 to Drummond, U.S. Pat. Nos. 4,425,540 and 4,647,836 to Olsen, U.S. Pat. No. 6,528,898 to Ikura et al. and U.S. Pat. No. 7,323,506 to Kouchachvili et al. Those devices simply utilize the fact that the dielectric constant of certain materials, such as ferroelectrics, varies as temperature varies. Specifically, those devices use the dielectrics as temperature dependent variable capacitors, the capacitance of which decreases as the temperature is increased by the absorption of heat. The capacitor is partially charged under an applied field at the lower temperature, and is then fully charged by increasing the electric field. The capacitor is then heated while under that large field, and it partially discharges as the dielectric constant decreases with increasing temperature and correspondingly decreasing capacitance. Further discharge occurs by reducing the applied field while the capacitor remains at high temperature. (U.S. Pat. No. 4,425,540 to Olsen). Such cycling of the temperature and dielectric constant of a capacitor under an applied field is referred to as the Olsen cycle.

The physics of the capacitor device is straightforward. The voltage V of a capacitor of capacitance C is inversely proportional to the dielectric constant $\in$:

$$V = Q/C = Q/[\in(T)\in_0(A/d)]$$

After the capacitor has been fully charged by application of the external field under the Olsen cycle, the capacitor is heated to a temperature at which the dielectric constant, $\in$, decreases. During that heating leg of the Olsen cycle, partial discharge occurs because the charge, Q, held by the capacitor decreases while V is held constant.

The use of dielectrics as variable capacitors to generate electricity is also reported by Olsen in Cascaded Pyroelectric Converter, 59 FERROELECTRICS 205 (1984). Olsen reports a maximum power density of 33 W/L (about 4 W/kg) using the ferroelectric PZST as the dielectric material in a variable capacitor device with multiple stages and regeneration. Using finite element simulation, Vanderpool calculates that the Olsen cycle yields a power density of 24 W/L (about 3 W/kg) under certain conditions using PZST as the dielectric material in a variable capacitor. Vanderpool, Simulations of a Prototypical Device Using Pyroelectric Materials for Harvesting Waste Heat, 51 INT. J. HT & MASS TRANSFER 5051 (2008).

The variable capacitor method of converting heat to electricity is not the most effective method of using ferroelectrics to generate electricity, however. True pyroelectric generation focuses, instead, on the inherent polarization that occurs in the ferroelectric phase, independent of polarization induced by an applied field. That inherent polarization provides a much more robust source of electric energy. Variable capacitors do not effectively exploit the powerful inherent spontaneous polarization that occurs in ferroelectrics without an applied field. Further, the application of large external fields and the continuous application of an external field during cycling impede the more powerful energy conversion that can be achieved with ferroelectrics. Such external fields prevent the effective use of the tremendous electrical energy that arises from the electric dipoles of ferroelectric materials spontaneously and without induction by an external field.

Therefore, a heretofore unaddressed need exists in the art to address the aforementioned deficiencies and inadequacies.

SUMMARY OF THE INVENTION

The present invention provides apparatuses and methods for converting heat to electric energy by the use of one or more ferroelectrics in which the phase transitions into and out of the ferroelectric phase occur at desired temperatures. When in the ferroelectric phase, very strongly polarized electric dipoles develop spontaneously in the unit cells of the one or more ferroelectrics, which occurs without the application of an external field. By poling to align the unit cells and domains, the polarization of the individual unit cells and domains combines to produce an extremely large net spontaneous polarization in the overall material system. That net polarization is designated as $P_s$, which may also be referred to as the remanent polarization, $P_r$, in the absence of an external field. The present invention particularly utilizes the spontaneous polarization, together with the rapid change in that polarization that occurs during phase transition, to convert heat to electrical energy. The present invention does not require temperature variability of the dielectric constant. The electrical energy that is generated as a result of spontaneous polarization, and released with the disappearance of polarization, can be much greater than the electrical energy generated with a ferroelectric through the application of an external electric field in the variable capacitor mode.

By utilization of one or more heat exchangers, the temperature of the ferroelectric material is controlled so that it undergoes transition into the ferroelectric phase. During or after transition to the ferroelectric phase, a small electric field is applied for the purpose of poling the ferroelectric. That poling field aligns the spontaneous electric dipoles to the extent allowed by the crystal structure of the particular material. Other than for such initial poling, an external electric field is not necessary as a part of the process or the cycling of the device. The application of an electric field, other than a minimal poling field, should generally be avoided with the invention because such applied fields generally interfere with the efficacy of utilizing spontaneous polarization and changes in polarization to convert heat to electric energy. Although application of large electric fields are essential for operation of variable capacitor devices and the Olsen cycle (for example, 28 kV/cm, in U.S. Pat. No. 4,425,540 to Olsen), the application of such external fields, and fields beyond the minimum required for poling, generally will diminish the effectiveness of the present invention in generating electrical energy.

When the ferroelectric material of the present invention is in its ferroelectric phase and poled, a very strong inherent electric field results naturally, without application of an external field, because of the strength of the spontaneous polarization in the ferroelectric. The spontaneous polarization gives rise to a very dense bound charge on the surfaces of the ferroelectric. As a result, a current flows to the electrodes that are located on the opposite sides of the ferroelectric until screened charges on the electrodes equal the opposing bound charges at the respective surfaces of the ferroelectric. At that point, the net electric field in the electrodes is negligible.

By utilization of one or more heat exchangers, the temperature of the ferroelectric is then changed so that it passes through the phase transition, becoming either paraelectric or antiferroelectric, depending upon the particular material used and the phase transition temperature around which the material is cycled. As the ferroelectric material undergoes that phase transition, its overall net spontaneous polarization becomes negligible and the bound charges on the surface of the ferroelectric disappear. That, in turn, renders the screening charges on the electrodes unscreened. As such, they may be removed from the electrodes to external circuitry at very high voltages.

The ferroelectric power generation module is then (1) cycled back to the ferroelectric phase by the use of heat exchangers that bring the material to a temperature that causes that phase transition, and (2) re-poled during that phase transition by application of a small electric field. The cycle is then repeated continuously, with the result that thermal energy is continuously converted to electrical energy at high voltage. The invention can be used with ferroelectrics that are in either solid or liquid form, the latter including liquid ferroelectrics and ferroelectric fine crystals suspended in liquid.

Exploiting the spontaneous polarization of ferroelectrics with the present invention allows a robust conversion of heat to electrical energy over a wide range of temperatures using heat supplied from a very wide range of sources, both naturally occurring and generated. Heat can be input to the ferroelectric from the heat source or withdrawn from the ferroelectric to the heat sink by conduction, convection or radiation or by any combination thereof.

The electrical energy available from exploiting changes in spontaneous polarization by cycling through phase change can be predicted quantitatively from the Landau-Ginzburg-Devonshire (LGD) theory, in which the free energy functional is expressed in terms of temperature, T, and polarization, P, whereby: $G(T,P) = \alpha_1(T) \cdot P^2 + \alpha_{11} \cdot P^4 + \alpha_{111} \cdot P^6$. The parameters are specific to the material system. The modeling based on the LGD functional also permits calculation of the free energy available when using a large applied field to induce polarization pursuant to the prior art and the Olsen cycle. While a quantitative comparison of the net energy generated by these two approaches is specific to the particular material system and the operational regimen, the LGD theory indicates that the electrical energy generated using spontaneous polarization considerably exceeds, for typical ferroelectrics and operational parameters, what can be attained under the prior art solely by inducing polarization with large applied fields.

A single stage ferroelectric power conversion module includes a single ferroelectric material. As such, it generally has a single phase transition temperature reflecting the transition between the ferroelectric phase and a non-polar phase, such as the paraelectric or the antiferroelectric phase. Electric power is generated by cycling the ferroelectric module above and below that phase transition temperature in accordance with the procedure and method described herein. In order to more effectively convert available thermal energy to electricity in applications where the temperature difference, $\Delta T$, between the heat source and heat sink is sufficient, a series of ferroelectric materials may be used that have a succession of phase transition temperatures that incrementally cover all, or at least some, of the range of temperatures between the heat source and heat sink. The magnitude of $\Delta T$ that warrants a multi-stage device depends on the parameters and requirements of the application and the characteristics of the particular ferroelectric used, such as the sharpness of the phase transition as a function of temperature, among other considerations.

In one aspect, the present invention relates to an apparatus for converting heat to electric energy. In one embodiment, the apparatus has a ferroelectric layer having a first surface and an opposite, second surface, where the ferroelectric layer is comprised of a ferroelectric material characterized with a phase transition temperature such that, when the material is in a ferroelectric phase spontaneous polarization is established in the unit cells of the ferroelectric, and the ferroelectric layer, upon poling, develops an overall net spontaneous polarization; and such that, as the temperature of the ferroelectric changes so that it traverses the transition temperature, the material enters a paraelectric or antiferroelectric phase wherein the ferroelectric layer has negligible or no overall net spontaneous polarization.

The apparatus also has a pair of electrodes respectively positioned on the first surface and the second surface of the ferroelectric layer, wherein the pair of electrodes is formed of a thermally and electrically conductive material, and one or more heat exchangers positioned in relation to the pair of electrodes for alternately inputting and removing heat through convection, conduction, or radiation to and from the ferroelectric layer so as to, respectively, heat the ferroelectric layer at a temperature $T_H$ that is higher than the phase transition temperature, and alternately cool the ferroelectric layer at a temperature $T_L$ that is lower than the phase transition temperature, so that the ferroelectric material of the ferroelectric layer thereby undergoes alternating phase transitions between (1) the ferroelectric phase and (2) the paraelectric or antiferroelectric phase. Further, the apparatus also has a voltage source positioned in relation to the ferroelectric layer and the pair of electrodes for applying a DC voltage and a resulting electric field for poling the ferroelectric layer in, or during the transition to, the ferroelectric phase, an external field not otherwise being applied to the ferroelectric layer.

The ferroelectric layer, the pair of electrodes, and the one or more heat exchangers are configured such that when the ferroelectric material of the ferroelectric layer is in the ferroelectric phase, electrically-opposite screening charges are respectively generated on the pair of electrodes, and when the ferroelectric material of the ferroelectric layer transitions into the paraelectric or antiferroelectric phase, the generated electrically-opposite screening charges on the pair of electrodes are discharged therefrom as electric energy.

In another aspect, the present invention relates to an apparatus for converting heat to electric energy. In one embodiment, the apparatus includes a ferroelectric layer having a first surface and an opposite, second surface. The ferroelectric layer is formed of a ferroelectric material characterized with a Curie temperature, $T_c$, such that when the temperature of the ferroelectric material is lower than the Curie temperature $T_c$, the ferroelectric material is in a ferroelectric phase in which spontaneous polarization is established in the unit cells of the ferroelectric material, and when the temperature of the ferroelectric material is greater than the Curie temperature $T_c$, spontaneous polarization is not established in the unit cells of the ferroelectric material.

The apparatus also includes a pair of electrodes respectively positioned on the first surface and the second surface of the ferroelectric layer. The pair of electrodes is formed of a thermally and electrically conductive material.

Furthermore, the apparatus includes a delivering means positioned in relation to the ferroelectric layer for alternately delivering a flow of cold fluid and a flow of hot fluid so as to alternately cool the ferroelectric layer at a first temperature $T_L$ that is lower than the Curie temperature $T_c$, and heat the ferroelectric layer at a second temperature $T_H$ that is higher than the Curie temperature $T_c$, so that the ferroelectric material of the ferroelectric layer thereby undergoes alternating phase transitions between the ferroelectric phase and the paraelectric phase with temperature cycling.

The ferroelectric layer, the pair of electrodes and the delivering means are configured such that when the ferroelectric material of the ferroelectric layer is in the ferroelectric phase, electrically-opposite screening charges are respectively generated on the pair of electrodes, and when the ferroelectric material of the ferroelectric layer transitions into the paraelectric phase, the generated electrically-opposite screening charges on the pair of electrodes are discharged therefrom as electric energy.

Additionally, the apparatus may have a pair of electric leads electrically connected to the pair of electrodes such that when the ferroelectric material of the ferroelectric layer is in or transitioning into the ferroelectric phase, a DC voltage is applied between the pair of electric leads to pole the unit cells and domains of the ferroelectric material so that the electrically-opposite screening charges are respectively generated on the pair of electrodes; and when the ferroelectric material of the ferroelectric layer transitions to the paraelectric phase, the electric energy corresponding to the generated electrically-opposite screening charges is output to the pair of electric leads at a voltage that is much higher than the DC voltage applied for poling.

Moreover, the apparatus may include means for monitoring one or more of the temperature of the ferroelectric layer, or the capacitance of the ferroelectric layer, or the temperature of the heating or cooling fluids.

In one embodiment, the delivery means comprises one or more heat exchangers in fluid communication with a heat source and a heat sink for inputting heat from the heat source to the ferroelectric layer so as to heat it at the second temperature $T_H$, and withdrawing the heat from the ferroelectric layer to the heat sink so as to cool the ferroelectric layer at the first temperature $T_L$.

In another embodiment, the delivering means comprises a first fluid passage and a second fluid passage adjacent to the pair of electrodes, respectively, such that when a flow of cold fluid passes through at least one of the first and second fluid passages, the ferroelectric layer is cooled towards the first temperature $T_L$, and when a flow of hot fluid passes through at least one of the first and second fluid passages, the ferroelectric layer is heated towards the second temperature $T_H$; one or more heat exchangers positioned such that the first and second fluid passages alternately deliver a flow of cold fluid and a flow of hot fluid so as to alternately cool the ferroelectric layer at a first temperature $T_L$, and heat the ferroelectric layer at a second temperature $T_H$; and a plurality of control valves in communication with the one or more heat exchangers for controlling the flow of cold and hot fluids. The plurality of control valves is controlled by microcontrollers.

In yet another aspect, the present invention relates to a method for converting heat to electric energy. In one embodiment, the method includes the steps of providing a ferroelectric layer having a first surface and an opposite, second surface, wherein the ferroelectric layer is formed of a ferroelectric material characterized with a phase transition temperature such that, when the material is in a ferroelectric phase spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization; and forming a pair of electrodes respectively on the first surface and the second surface of the ferroelectric layer, the pair of electrodes being formed of a thermally and electrically conductive material.

The method also includes the step of alternately inputting and removing heat through convection, conduction, or radiation to and from the ferroelectric layer so as to, respectively, heat the ferroelectric layer at a temperature $T_H$ that is higher than the phase transition temperature, and alternately cool the ferroelectric layer at a temperature $T_L$ that is lower than the phase transition temperature, so that the ferroelectric material of the ferroelectric layer thereby undergoes alternating phase transitions between (1) the ferroelectric phase and (2) the paraelectric or antiferroelectric phase.

The method further includes the steps of poling the spontaneous polarization of the unit cells and domains of the ferroelectric material of the ferroelectric layer so as to generate electrically-opposite screening charges on the pair of electrodes when the ferroelectric material of the ferroelectric layer is in the ferroelectric phase, and outputting electric energy corresponding to the generated electrically-opposite screening charges on the pair of electrodes when the ferroelectric material of the ferroelectric layer transitions into the paraelectric or antiferroelectric phase.

In yet another aspect, the present invention relates to a method for converting heat to electric energy. In one embodiment, the method includes the steps of providing a ferroelectric layer having a first surface and an opposite, second surface, wherein the ferroelectric layer is formed of a ferroelectric material characterized with a Curie temperature, $T_c$, such that when the temperature of the ferroelectric material is lower than the Curie temperature, $T_c$, the ferroelectric material is in a ferroelectric phase in which spontaneous polarization is established in the unit cells of the ferroelectric material; and when the temperature of the ferroelectric material is greater than the Curie temperature $T_c$, spontaneous polarization is not established in the unit cells of the ferroelectric material; and forming a pair of electrodes respectively on the first surface and the second surface of the ferroelectric layer, the pair of electrodes being formed of a thermally and electrically conductive material.

The method also includes the step of alternately delivering a flow of cold fluid and a flow of hot fluid so as to alternately cool the ferroelectric layer at a first temperature $T_L$ that is lower than the Curie temperature, $T_c$, and heat the ferroelectric layer at a second temperature $T_H$ that is higher than the Curie temperature, $T_c$; thereby the ferroelectric material of the ferroelectric layer undergoes alternating phase transitions between the ferroelectric phase and the paraelectric phase within temperature cycling.

The method further includes the steps of poling the spontaneous polarization of the unit cells and domains of the ferroelectric material so that the net spontaneous polarization of the ferroelectric layer overall generates electrically-opposite screening charges on the pair of electrodes when the ferroelectric material is in the ferroelectric phase, and outputting electric energy corresponding to the generated electrically-opposite screening charges on the pair of electrodes when the ferroelectric material of the ferroelectric layer transitions to the paraelectric phase.

Additionally, the method also includes the step of forming a first fluid passage and a second fluid passage on the pair of electrodes, respectively, such that when a flow of cold fluid passes through at least one of the first and second fluid passages, the ferroelectric layer is cooled towards the first temperature $T_L$, and when a flow of hot fluid passes through at least one of the first and second fluid passages, the ferroelectric layer is heated towards the second temperature $T_H$.

The method may also have the step of monitoring one or more of the temperature and capacitance of the ferroelectric layer and the temperature of the heating and cooling fluids.

In one embodiment, the poling step is performed by applying a DC voltage between the pair of electrodes to align the spontaneous polarization of the unit cells and the domains of the ferroelectric material of the ferroelectric layer so that electrically-opposite bound charges are respectively generated on the first and second surfaces of the ferroelectric layer, thereby generating electrically-opposite screening charges on the pair of electrodes. The electric energy output from the electrodes in conjunction with the transition to the paraelectric phase is in the form of a voltage that is much higher than the DC voltage applied for poling.

In one embodiment, the delivering step is performed by one or more heat exchangers that are in fluid communication with a heat source and a heat sink for inputting heat from the heat source to the ferroelectric layer so as to heat it at the second temperature $T_H$, and withdrawing heat from the ferroelectric layer to the heat sink so as to cool the ferroelectric layer at the first temperature $T_L$.

In another embodiment, the delivering step is performed by one or more heat exchangers and a plurality of control valves in communication with the one or more heat exchangers, wherein are positioned first and second fluid passages for alternately delivering a flow of cold fluid and a flow of hot fluid so as to alternately cool the ferroelectric layer at a first temperature $T_L$, and heat the ferroelectric layer at a second temperature $T_H$, and wherein the plurality of control valves is adapted for controlling the flow of cold and hot fluid.

In a further aspect, the present invention relates to an apparatus for converting heat to electric energy. In one embodiment, the apparatus has a plurality of ferroelectric modules, $\{FM^n\}$, arranged in a stack, where n=1, 2, 3, ... N, N being an integer greater than one. Each ferroelectric module $FM^n$ includes a ferroelectric layer having a first surface and an opposite, second surface, wherein the ferroelectric layer is formed of a ferroelectric material characterized with a transition temperature, $T^n$, such that when the ferroelectric material is in a ferroelectric phase, spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization.

In one embodiment, a pair of electrodes formed of a thermally and electrically conductive material is formed on the first surface and the second surface of the ferroelectric stack. In another embodiment, such electrodes are also formed on the first surface and the second surface of each ferroelectric module, $FM^n$; and in yet another embodiment, such electrodes between adjacent ferroelectric modules are separated by an electrical insulator. The transition temperatures $\{T^n\}$ of the plurality of ferroelectric modules $\{FM^n\}$ may vary successively across the range between temperatures of a heat source and a heat sink.

The apparatus further includes a delivering means positioned in relation to the stacked ferroelectric modules $\{FM^n\}$ for alternately inputting and removing heat through convection, conduction, or radiation to and from the stacked ferroelectric modules $\{FM^n\}$ so as to alternately cool the stacked ferroelectric modules $\{FM^n\}$ at a first temperature $T_L$ that is lower than each transition temperature $T^n$, and heat the stacked ferroelectric modules $\{FM^n\}$ at a second temperature $T_H$ that is higher than each transition temperature $T^n$, such that each ferroelectric layer of the stacked ferroelectric modules $\{FM^n\}$ thereby undergoes alternating phase transitions between (1) the ferroelectric phase and (2) the paraelectric or antiferroelectric phase.

The ferroelectric modules $\{FM^n\}$, the electrodes, and the delivering means are configured such that when the ferroelectric material of the ferroelectric layer is in the ferroelectric phase, electrically-opposite screening charges are respectively generated on the electrodes, and when the ferroelectric material of the ferroelectric layer transitions into the paraelectric or antiferroelectric phase, the generated electrically-opposite screening charges on the electrodes are discharged therefrom as electric energy.

The apparatus also includes a voltage source positioned in relation to the stacked ferroelectric modules $\{FM^n\}$ so that, when the ferroelectric layers of the stacked ferroelectric modules $\{FM^n\}$ are in the ferroelectric phase or transitioning into the ferroelectric phase, a DC voltage and a resulting electric field are applied to the ferroelectric layers of the stacked ferroelectric modules $\{FM^n\}$ to pole the ferroelectric layers so that screening charges are generated on the electrodes. The apparatus further includes means positioned in relation to the stacked ferroelectric modules $\{FM^n\}$ so that, when the ferroelectric layers of the stacked ferroelectric modules $\{FM^n\}$ transition into the paraelectric or antiferroelectric phase, the generated screening charges on the electrodes are discharged therefrom as electric energy. In one embodiment, the means includes at least first and second electric leads electrically connected to the first and second electrodes, respectively, for applying the DC voltage and the resulting electric field for poling the ferroelectric layer in the ferroelectric phase or during the transition into the ferroelectric phase, and for outputting the electric energy corresponding to the generated electrically-opposite screening charges discharged during the transition into the paraelectric or antiferroelectric phase.

In yet a further aspect, the present invention relates to an apparatus for converting heat to electric energy. In one embodiment, the apparatus has a plurality of ferroelectric modules, $\{FM^n\}$, arranged in a stack, where n=1, 2, 3, ... N, N being an integer greater than one. Each ferroelectric module FM″ includes a ferroelectric layer having a first surface and an opposite, second surface, wherein the ferroelectric layer is formed of a ferroelectric material characterized with a Curie temperature, $T_c''$, such that when the temperature of the ferroelectric material is lower than the Curie temperature, $T_c''$, the ferroelectric material is in a ferroelectric phase in which spontaneous polarization is established in the unit cells of the ferroelectric material, and when the temperature of the ferroelectric material is greater than the Curie temperature, $T_c''$, spontaneous polarization is not established in the unit cells of the ferroelectric material; and in one embodiment a first electrode and a second electrode positioned on the first surface and the second surface of the ferroelectric stack, respectively; and in another embodiment a first electrode and a second electrode positioned on the first surface and the second surface of each ferroelectric module, FM″. Different ferroelectric layers of the plurality of ferroelectric modules {FM″} are formed of an identical ferroelectric material or different ferroelectric materials. In one embodiment where a first electrode and a second electrode are positioned on the first surface and the second surface of each ferroelectric module, FM″, each two adjacent ferroelectric modules are separated by an electrical insulator. The Curie temperatures $\{T_c''\}$ of the plurality of ferroelectric modules {FM″} may vary successively across the range between temperatures of a heat source and a heat sink.

The apparatus further includes a delivering means positioned in relation to the stacked ferroelectric modules {FM″} for alternately delivering a flow of cold fluid and a flow of hot fluid over the stacked ferroelectric modules {FM″} so as to alternately cool the stacked ferroelectric modules {FM″} at a first temperature $T_L$ that is lower than each Curie temperature $T_c''$, and heat the stacked ferroelectric modules {FM″} at a second temperature $T_H$ that is higher than each Curie temperature $T_c''$, thereby each ferroelectric layer of the stacked ferroelectric modules {FM″} undergoes alternating phase transitions between the ferroelectric phase and the paraelectric phase with temperature cycling.

The apparatus may further comprise means for monitoring the temperature and capacitance of one or more ferroelectric modules FM″and the temperature of the heating and cooling fluids.

In operation, when each ferroelectric layer of the stacked ferroelectric modules {FM″} is in the ferroelectric phase, a DC voltage is applied to the stacked ferroelectric modules {FM″} to pole the modules {FM″} by aligning the unit cells and the domains of the ferroelectric material of each ferroelectric module FM″ so that the electrically-opposite screening charges are respectively generated, in one embodiment, on the first and second electrodes of the ferroelectric stack, {FM″}; and in another embodiment, on the first and second electrodes of each ferroelectric module FM″. When the ferroelectric layers of the stacked ferroelectric modules {FM″} transition to the paraelectric phase, electric energy corresponding to the generated electrically-opposite screening charges on the first and second electrodes of the ferroelectric stack, {FM″}, in one embodiment, and of the first and second electrodes of each ferroelectric module FM″ in another embodiment, is output at a voltage that is much higher than the DC voltage applied for poling. Other than the minimum voltage for poling, a voltage is not applied during the operation.

In one embodiment, the delivering means comprises one or more heat exchangers positioned in relation to the first and second electrodes of the stacked ferroelectric modules {FM″}, respectively, and in fluid communication with a heat source and a heat sink for inputting heat from the heat source to the stacked ferroelectric modules {FM″} so as to heat the stacked ferroelectric modules {FM″} at the second temperature $T_H$, and withdrawing heat from the stacked ferroelectric modules {FM″} to the heat sink so as to cool the stacked ferroelectric modules {FM″} at the first temperature $T_L$, thereby causing the alternating cycling of each ferroelectric module FM″ around its respective transition temperature, $T_c''$, so that each ferroelectric module FM″ undergoes alternating phase transitions between the ferroelectric phase and the paraelectric phase with temperature cycling.

In another embodiment the delivering means comprises a plurality of first fluid passages and second fluid passages, each first fluid passage and each second fluid passage respectively formed on the first electrode and the second electrode of corresponding ferroelectric modules FM″ such that when a flow of cold fluid passes through at least one of the first and second fluid passages, the corresponding ferroelectric modules FM″ are cooled towards the first temperature $T_L$, and when a flow of hot fluid passes through at least one of the first and second fluid passages, the corresponding ferroelectric modules FM″ are heated towards the second temperature $T_H$; a plurality of first heat exchangers and second heat exchangers, each first heat exchanger and each second heat exchanger respectively positioning the first fluid passage and the second fluid passage of the corresponding ferroelectric modules FM″ for alternately delivering a flow of cold fluid and a flow of hot fluid so as to alternately cool and heat the corresponding ferroelectric modules FM″ such that the ferroelectric modules FM″ cycle around their respective phase transition temperatures; and a plurality of control valves in communication with the plurality of first heat exchangers and second heat exchangers for controlling the flow of cold and hot fluids. In one embodiment, the plurality of control valves is controlled by microcontrollers.

The invention can be used for an extremely broad range of applications, including both for improvements to exiting devices and for new devices. By way of example and not with any intention to limit the examples that are intended as illustrative, others being apparent to those skilled in the art, such applications include: (1) bottoming up thermal power plants by converting waste heat to additional power output; (2) use of the present invention as the principal or sole means of converting thermal energy to electricity at power plants; (3) generation of electric power from geothermal energy sources, including passive geothermal heating and cooling systems; (4) generation of electric power from heat provided by solar energy, such generation being on any scale from, for example, a few watts or less to over 1,000 MW; (5) generation of distributed power with portable or quasi-portable generators using a variety of heat sources and operating on a scale from, for example, a few watts or less to 100 kW or more; (6) conversion to power of waste heat from industrial, mining, and other such sources; (7) power electric motor vehicles by generating electricity from thermal energy produced at the vehicle by combusting gas or other means; (8) producing electric power for diesel electric locomotives either from their waste heat or as the principal means of generating electricity; (9) generation of power from ocean thermal gradients; (10) cooling and refrigeration in a multitude of specific applications, whereby electric energy is used to extract heat from the desired source, in reverse operation of the cycling used to generate electricity from heat; (11) generation of electricity for personal or medical use from body heat; (12) small power sources for personal electronic devices, PCs, GPS systems, and the like; (13) generation of power from heat from biomass or municipal waste; and (14) power generation in space from, for example, heat generated by radioisotopes.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, wherein.

DETAILED DESCRIPTION OF THE INVENTION

Figure 1:
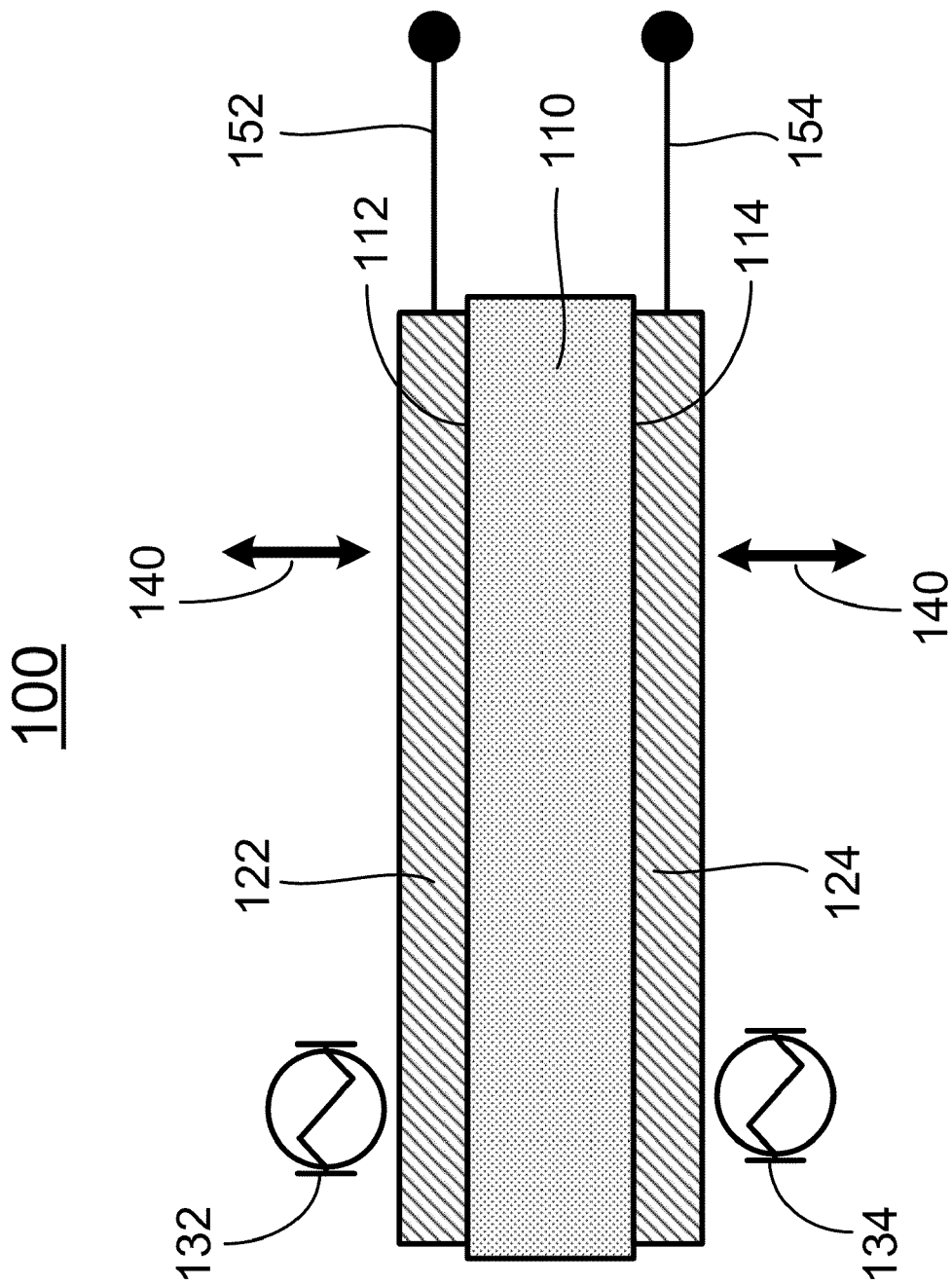
FIG. 1 is schematically a cross-sectional view of a ferroelectric device for converting heat to electric energy that utilizes changes in spontaneous polarization that occurs in temperature cycling to generate electric charges that can be removed to external circuitry at high voltage, according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Additionally, some terms used in this specification are more specifically defined below.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 16:
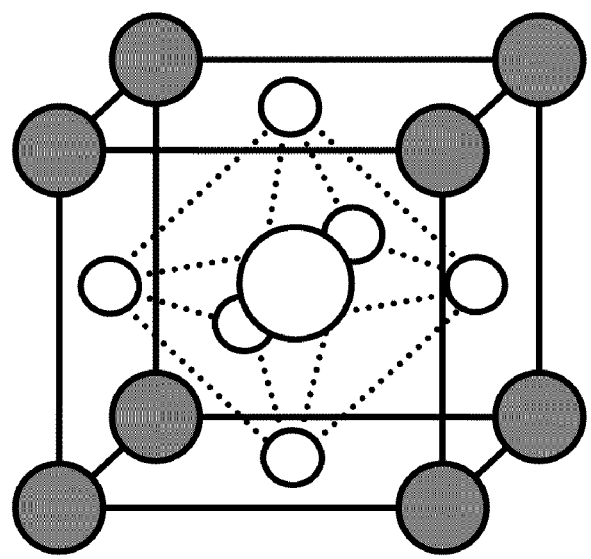
FIG. 16 illustrates schematically the shift from (a) the paraelectric cubic state of a Perovskite crystal to (b) the tetragonal configuration, the latter reflecting the ferroelectric state with displaced ions that arise from deformation of the unit cell, thereby making the unit cell an electric dipole, which in the aggregate with the other dipoles throughout the material give rise to spontaneous polarization, $P_s$.
Figure 16:
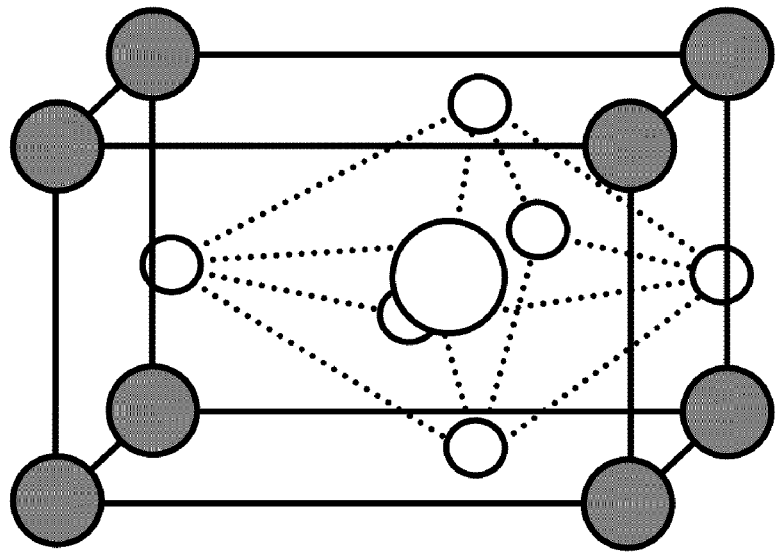
Figure 17:
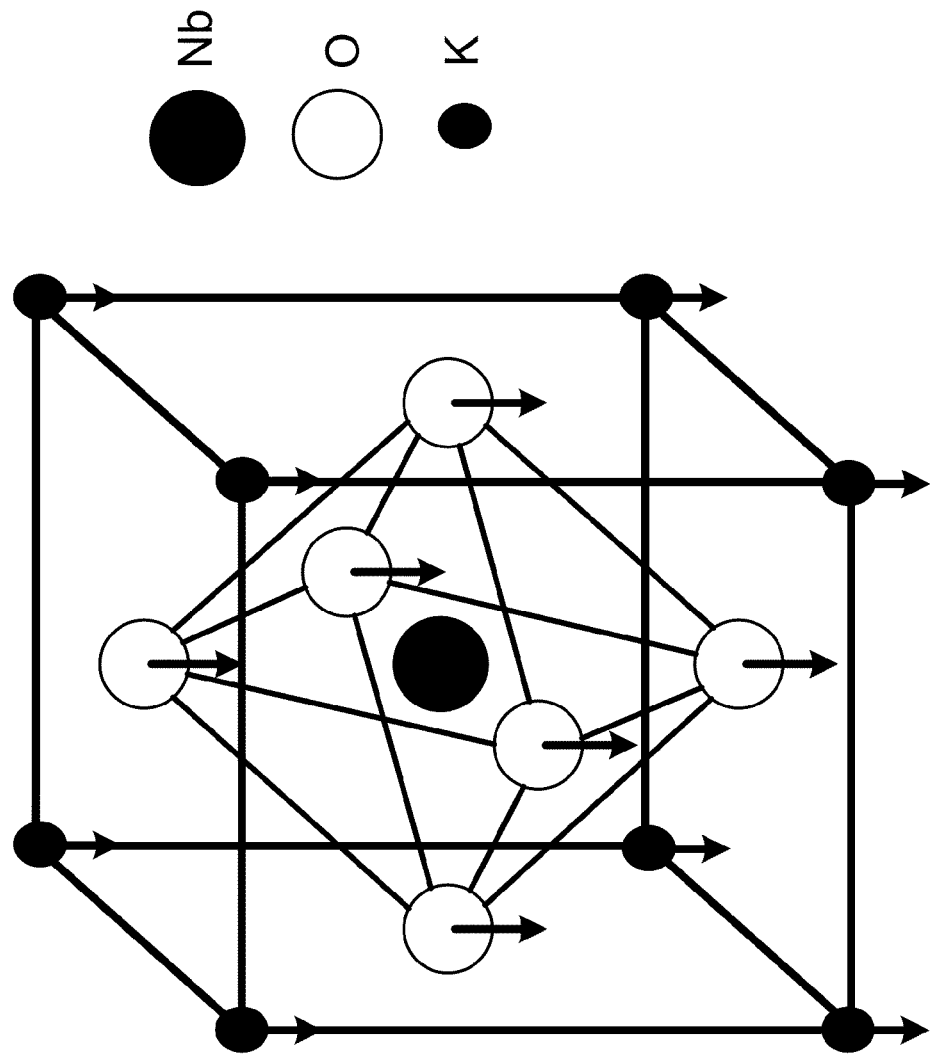
FIG. 17 illustrates schematically the displacement of potassium and oxygen ions on the corners and faces, respectively, of $KNbO_3$ in the ferroelectric state, where the ionic displacement creates spontaneous polarization.

As used herein, the term "unit cell" refers to a crystal structure that is a unique arrangement of atoms in a crystal. A crystal structure is composed of a motif, a set of atoms arranged in a particular way, and a lattice. Motifs are located upon the points of a lattice, which is an array of points repeating periodically in three dimensions. The points can be thought of as forming identical tiny boxes, called unit cells, that fill the space of the lattice. The lengths of the edges of a unit cell and the angles between them are called the lattice parameters. The crystal structure of a material or the arrangement of atoms in a crystal structure can be described in terms of its unit cell. The unit cell is a tiny box containing one or more motifs, a spatial arrangement of atoms. The unit cells stacked in three-dimensional space describe the bulk arrangement of atoms of the crystal. The crystal structure has a three dimensional shape. The unit cell is given by its lattice parameters, the length of the cell edges and the angles between them, while the positions of the atoms inside the unit cell are described by the set of atomic positions measured from a lattice point. Examples of unit cells are illustrated in FIGS. 16 and 17.

As used herein, the term "Curie temperature" or $T_c$ refers to a characteristic property of a ferroelectric material. At temperatures below the Curie temperature, the ferroelectric material generally is in a ferroelectric phase in which spontaneous polarization is established in the unit cells of the ferroelectric material. As the temperature is increased towards the Curie temperature, the spontaneous polarization established in the unit cells decreases. Above the Curie temperature, the ferroelectric material is generally in a paraelectric phase in which spontaneous polarization is not established in the unit cells of the ferroelectric material. There are ferroelectrics, however, where a ferroelectric phase exists at temperatures above the transition temperature, and the material is paraelectric below that transition temperature. Also, there are transition temperatures between ferroelectric and antiferroelectric phases that are relevant to the invention, as described herein. There does not appear to be a clearly established usage as to whether "Curie temperature" also applies to the transition temperatures for these latter kinds of phase transitions. In the specification, the terms "phase transition temperature" and "transition temperature" are used to include all of the foregoing types of phase transitions. "Curie temperature" or $T_c$ will generally be used only in conjunction with the first type of phase transition, though it may be used otherwise if clearly apparent from the context.

In practice, for all of the above described types of phase transitions, the sharpness of the phase change as the material temperature crosses the transition temperature is determined by the homogeneity of the composition and the crystal structure, such that the transition between phases may take place progressively as the temperature of the ferroelectric material increases or decreases, respectively, over a temperature range around the designated transition temperature or Curie temperature of the material.

Without intent to limit the scope of the invention, exemplary apparatuses and methods and their related results according to the embodiments of the present invention are given below. Note that titles or subtitles may be used in the examples for convenience of a reader, which in no way should limit the scope of the invention. Moreover, certain theories are proposed and disclosed herein; however, in no way, whether they are right or wrong, should they limit the scope of the invention so long as the invention is practiced according to the invention without regard for any particular theory or scheme of action.

In accordance with the purposes of this invention, as embodied and broadly described herein, this invention, in one aspect, relates to an apparatus and method for converting thermal energy directly to electrical energy through a ferroelectric medium without the energy passing through intermediate mechanical or other mechanisms or through other forms. The invention exploits the large inherent spontaneous polarization that develops in ferroelectric materials when they are in their ferroelectric phase. The spontaneous polarization that arises in the unit cells of ferroelectric materials, which is exploited by the invention, occurs without application of an external E field. The unit cell polarization occurs spontaneously as a result of the material transitioning into a ferroelectric phase. The powerful spontaneous polarization of the unit cells produces a large overall net polarization in the ferroelectric material as a whole when the unit cells and domains have been aligned by poling. The invention further exploits the large changes in overall net spontaneous polarization that occur when a change in the temperature of the ferroelectric material causes a phase transition to a phase that has negligible net polarization.

The invention permits the removal and use of the electrical energy generated by the spontaneous polarization when the material is in the ferroelectric phase. The electrical energy is exported to external circuitry where it can be utilized for general purposes independent of the invention. The exportation of that stored electrical energy is accomplished in the course of the phase transition of the material from the ferroelectric phase. The inherent net spontaneous polarization, $P_s$, disappears as that transition occurs. Commonly, the phase transition that renders $P_s$ negligible will be from the ferroelectric phase to the paraelectric phase, but it may also be from the ferroelectric phase to the antiferroelectric phase, since the antiferroelectric phase produces negligible net spontaneous polarization in the material overall.

To allow the conversion of thermal energy to electrical energy with the invention, the basic ferroelectric module must be cycled around its phase transition temperature. That temperature cycling is accomplished by one or more heat exchangers that interface between the ferroelectric module and the available heat source and heat sink. The heat exchangers and heat source are not limited and may include any mode by which thermal energy is transferred, whether convective, conductive or radiative. The invention can broadly be used to convert thermal energy where: (1) at least a portion of the temperature range between the heat source temperature, $T_H$, and heat sink temperature, $T_L$, are within the range of phase transition temperatures for one of the many ferroelectric materials that exist; and (2) the temperature difference, $\Delta T = (T_H - T_L)$, is sufficient to allow effective conversion for the particular application.

There are ferroelectrics with phase transition temperatures that range from as low as about 0° C. to as high as about 700° C., and the invention can be operated in that range with such ferroelectrics. There is no theoretical limit to the operating temperature of the apparatus or method, and it can also be used at temperatures below 0° C. and above 700° C. insofar as appropriate ferroelectrics are available.

The magnitude of the temperature difference, $\Delta T$, that may be sufficient to use the device, depends largely on practical issues, such as the efficiency desired for an application. For a ferroelectric material in which the phase transition substantially occurs over, say, a temperature difference, $\Delta T$, of 1° C., the device may be used to generate electrical energy from a heat source and sink with a $\Delta T$ of that magnitude, provided $T_H$ and $T_L$ bound the phase transition temperature. The practical utility of operating with such a small temperature difference will be constrained by the Second Law of Thermodynamics and the Carnot limitation. The maximum possible conversion efficiency of available thermal energy in any context is given by the Carnot efficiency, whereby $\eta_c = \Delta T/T_H$. Thus, the magnitude of the temperature difference, $\Delta T$, desired to operate the device in a practical application will depend upon the specifics of the application; engineering parameters or constraints associated with the application; the characteristics of the heat source and heat sink; the heat flux; the performance characteristics of the particular ferroelectric(s) that has the necessary phase transition temperatures; economic considerations; the practical importance of generating electricity from the particular heat source; and other considerations. While the temperature difference $\Delta T \geq 5°$ C., for example, may generally permit effective use of the invention, the temperature difference may need to be greater, or it could be less, for a particular application and materials system, based on the factors stated, among others.

The invention is not limited or specific to any particular heat exchanger format or configuration; to any particular heat source or heat sink; nor to any particular thermal characteristics of the heat source or heat sink. Rather, the device is general and may be used to effectively convert available thermal energy to electricity and, conversely, to cool using electrical energy. Heat input and withdrawal to and from the ferroelectric to cause temperature and phase cycling can be accomplished by thermal transport through convection, conduction or radiation In general, different ferroelectric materials can be used to practice the present invention. A particular ferroelectric will be effective in converting heat to electrical energy when cycled around its phase transition temperature or temperatures. As noted, the phase transition that often will be utilized with the invention is that from ferroelectric to paraelectric and back to ferroelectric. However, the phase transition from ferroelectric to antiferroelectric and back may also be utilized with the invention. First order transitions are common among ferroelectric materials, and many first order transition materials are appropriate for use with the invention. Ferroelectric materials that exhibit second order transitions may also be used with the invention.

Criteria that affect the suitability of a ferroelectric material for a particular application include: (1) a phase transition temperature that matches the available range of thermal energy from the heat source and heat sink; (2) the sharpness of the phase transition of that material as a function of temperature (generally, it is preferable that the phase transition substantially occur during a temperature change of less than 10° C., though broader transitions may be used); (3) the strength of the spontaneous polarization of the material in the ferroelectric state (preferably $\geq 10$ µC cm$^{-2}$, though materials with less spontaneous polarization may also be used); (4) a sufficiently high resistivity to avoid the charges on the electrodes from leaking through the ferroelectric medium before the stored electrical energy can be removed externally at high voltage; (5) the ability to pole during the transition to the ferroelectric state with a field that is comparatively small so that the poling voltage will be substantially less than the voltage at which the charge is removed (generally, it is desirable that the poling voltage be less than about 20% of the generated voltage, and preferably less than about 5%); and (6) a comparatively high ferroelectric transition energy, or enthalpy, in comparison to the energy required to heat the lattice during cycling (this factor will depend in part on the magnitude of the temperature difference between the high and low cycling temperatures).

Many ferroelectric materials exhibit properties that make them particularly suitable for use with the invention. Lead based ferroelectric materials systems, for example, provide a wide range of materials combinations, such as PZT, PZST, PLT, etc., that may be used effectively. The particular percentage compositions of the constituent elements will affect the specific performance characteristics of the material, including the phase transition temperature. The phase transition temperatures and other factors thus are varied and controlled by varying the proportions of the constituent elements. A list of many of the ferroelectrics and antiferroelectrics that may be used with the invention is set forth in M. Lines and A. Glass, PRINCIPLES AND APPLICATIONS OF FERROELECTRICS AND RELATED MATERIALS, APP. F (1977, Oxford reprint 2004), though the list is not exhaustive. The invention can be used with ferroelectrics that are in either solid or liquid form, the latter including, for example, liquid ferroelectrics and ferroelectric fine crystals suspended in a liquid appropriate for a particular application.

Figure 18:
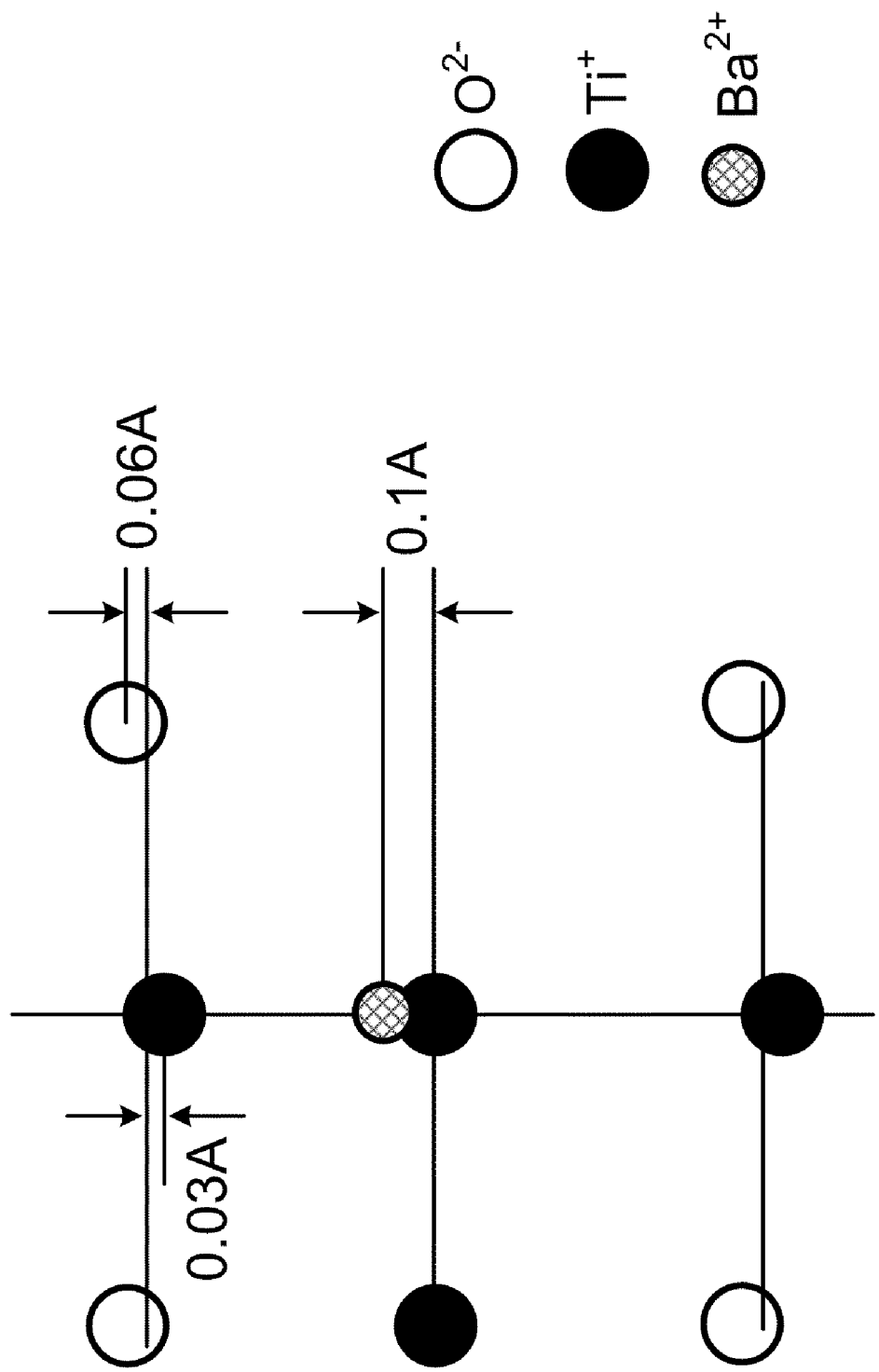
FIG. 18 illustrates the magnitude of the ionic displacements that occur in the unit cell of the Perovskite barium titanate, $BaTiO_3$, when in the ferroelectric phase and that give rise to spontaneous polarization, $P_s$.

By way of example, a number of Perovskite crystals exhibit phase transition phenomena that provide an effective ferroelectric to be used in the invention. Perovskite ferroelectrics, such as PZT or PLT, undergo mostly first order transitions from the ferroelectric to paraelectric phase when the unit cell structure undergoes transition from cubic (paraelectric phase) to tetrahedral (ferroelectric phase). FIG. 16 illustrates the unit cell structure for a Perovskite crystal in the paraelectric phase where the material temperature is great than $T_c$. In the example, the eight corners of the cube are occupied by lead atoms; the six faces of the cube are occupied by oxygen atoms; and the center of the cube is occupied by a titanium or zirconium atom. FIG. 16 also depicts the shift in the relative positions of the ions when the material is in the ferroelectric phase and $T<T_c$. It is that shift that gives rise to the local electric dipole of the unit cell, and it is those electric dipoles that, in the aggregate, produce the spontaneous polarization of the ferroelectric material, $P_s$. FIG. 17 depicts similar displacement and unit cell polarization for potassium niobate, $KNbO_3$, in the ferroelectric phase. FIG. 18 illustrates the magnitude of the physical displacement, in angstroms, that may occur among the ions in the unit cell in the ferroelectric phase, which displacement gives rise to the unit cell electric dipole.

Referring to FIG. 1, a single-stage ferroelectric conversion device/apparatus 100 that utilizes the change in spontaneous polarization that occurs from temperature cycling to generate electric charges that are discharged to an external circuitry at high voltage is schematically shown according to one embodiment of the present invention. The apparatus 100 includes a ferroelectric layer 110 having a first surface 112 and an opposite, second surface 114. The ferroelectric layer 110 is formed of a solid or liquid ferroelectric material that is characterized by a phase transition temperature at which the material undergoes a phase change from the ferroelectric phase to either the paraelectric or antiferroelectric phase and back again as the temperature change is reversed. The ferroelectric layer 110 may be formed of a ferroelectric material that is characterized with a Curie temperature, $T_c$, such that when the temperature of the ferroelectric material is lower than the Curie temperature $T_c$, the ferroelectric material is in a ferroelectric phase in which spontaneous polarization is established in the unit cells of the ferroelectric material, and when the temperature of the ferroelectric material is greater than the Curie temperature, $T_c$, spontaneous polarization is not established in the unit cells of the ferroelectric material. The ferroelectric layer 110 may also be formed of a ferroelectric material that undergoes phase transition from ferroelectric to paraelectric as the temperature of the ferroelectric material decreases below the transition temperature. The ferroelectric layer 110 may also be formed of a ferroelectric material that undergoes phase transition from the ferroelectric phase to the antiferroelectric phase at a phase transition temperature, such material changing back to the ferroelectric phase when the temperature change is reversed. The ferroelectric layer 110 has a thickness defined between the first surface 112 and the second surface 114. The thickness required in practice depends upon several parameters including the particular application and the characteristics and amount of heat available to be converted to electricity; the particular ferroelectric material utilized; and the thermal conductivity of the ferroelectric material. Typically, the thickness of the ferroelectric layer 110 in one stage of the apparatus 100 is between about 0.01 mm and about 1 cm. Other values of the thickness can also be utilized to practice the invention.

Figure 10:
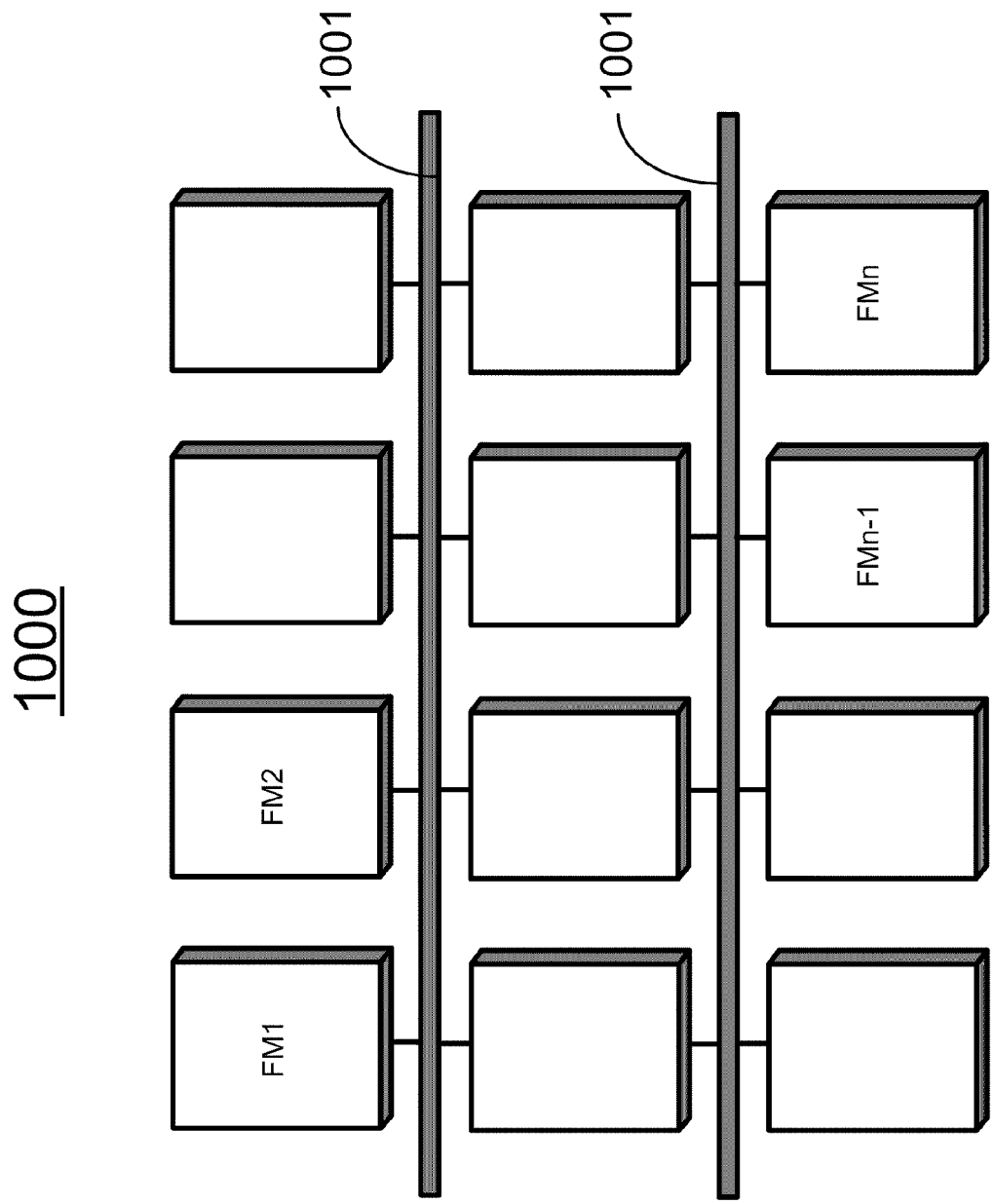
FIG. 10 shows schematically a ferroelectric device for converting heat to electric energy according to one embodiment of the present invention.

The width and length of the ferroelectric layer 110 is determined by the nature of the ferroelectric material, the particular application, and the characteristics and amount of heat available to be converted to electricity. There is no theoretical limit on the width and length of the ferroelectric layer 110. Limitations are practical manufacturing limitations that may exist from time to time for a particular ferroelectric material and operational factors of a particular application. Where the width and length of the ferroelectric layer 110 is limited by practical considerations, a number of similar or identical devices can be arranged in an array or in a stack to effectively expand the surface available for communication with the heat exchangers that interface the device depicted in FIG. 1 with the heat source and heat sink. In such an application, the conductive leads from the electrodes may be joined to electrical buses, and the cumulative array would then act as a larger device having a heat exchanger area approximately equal to the total area of the individual devices, thereby permitting generation of electric power limited only by the quantity and character of the available thermal energy. One example of such an array is illustrated by FIG. 10.

A pair of electrodes 122 and 124 is respectively positioned on the first surface 112 and the second surface 114 of the ferroelectric layer 110. The pair of electrodes 122 and 124 is formed of a thermally and electrically conductive material. As formed, such electrodes 122 and 124 are substantially in contact with the first and second surfaces 112 and 114 of the ferroelectric material/layer 110 so as to provide electrical contact and maximize thermal conductivity. The pair of electrodes 122 and 124 may be comprised of, for example, a thin coating of silver of a thickness sufficient to permit the conduction of the current that is generated but sufficiently thin to minimize interference with thermal conductivity between the heat exchangers and the ferroelectric material. The thickness of the silver electrodes can be about 1-5 microns, for example. In some embodiments, it may be desirable to have the electrode set back slightly from the edges of the ferroelectric layer 110 by, for example, 1 mm, to avoid electrical discharge around the edge of the ferroelectric layer 110.

Additionally, the apparatus 100 includes a delivering means positioned in relation to the pair of electrodes 122 and 124 for alternately delivering 140 heat to and from the first surface 112 and the second surface 114 of the ferroelectric layer 110 so as to alternately cool the ferroelectric layer 110 at a first temperature $T_L$ that is lower than the transition temperature, and heat the ferroelectric layer 110 at a second temperature $T_H$ that is higher than the transition temperature, so that the ferroelectric material of the ferroelectric layer 110 thereby undergoes, with temperature cycling, alternating phase transitions between (1) the ferroelectric phase and (2) the paraelectric or antiferroelectric phase. In this exemplary embodiment, the delivering means comprises two heat exchangers 132 and 134 in fluid communication with a heat source and a heat sink (not shown) for inputting heat from the heat source to the ferroelectric layer 110 so as to heat the ferroelectric layer 110 at the second temperature $T_H$, and withdrawing heat from the ferroelectric layer 110 to the heat sink so as to cool the ferroelectric layer 110 at the first temperature $T_L$. In one embodiment, the first temperature $T_L$ can be the temperature of the heat sink, while the second temperature $T_H$ can be the temperature of the heat source. Two heat exchangers 132 and 134 are operated in order to: (1) thermally cycle the ferroelectric around its phase transition temperature, thereby cycling the material alternately between the ferroelectric phase and a non-polar phase, and thereby cycling the material alternately from high levels of overall net spontaneous polarization to negligible levels; and (2) input thermal energy from the heat source at the temperature $T_H$ into the ferroelectric material and withdraw thermal energy from the ferroelectric into the heat sink at the temperature $T_L$. This absorption and rejection of thermal energy is integral to satisfying the Second Law of Thermodynamics, which dictates that thermal energy can be converted to another form of energy, or to work, only in a process of heat absorption and heat rejection.

The apparatus 100 also has a pair of electric leads 152 and 154 electrically connected to the pair of electrodes 122 and 124, respectively, such that when the ferroelectric material of the ferroelectric layer 110 is in or transitioning into the ferroelectric phase, a DC voltage is applied between the pair of electric leads 152 and 154 to pole the unit cells and domains of the ferroelectric material, thus enabling a very large overall net spontaneous polarization to result in the ferroelectric layer, which in turn induces very dense electrically-opposite screening charges respectively on the pair of electrodes 122 and 124; and when the ferroelectric material of the ferroelectric layer 110 transitions into the paraelectric or antiferroelectric phase, the electric energy corresponding to the generated electrically-opposite screening charges is output to the pair of electric leads 152 and 154 at a voltage that is much higher than the applied DC poling voltage. The pair of electric leads 152 and 154 allows the connection of the DC power supply for poling purposes, and permits the conduction of the discharge current from the electrodes to whatever external load may be used or to busses to collect and distribute the electricity generated by multiple devices. A voltage is not applied between the pair of electric leads 152 and 154 other than for poling.

Figure 2:
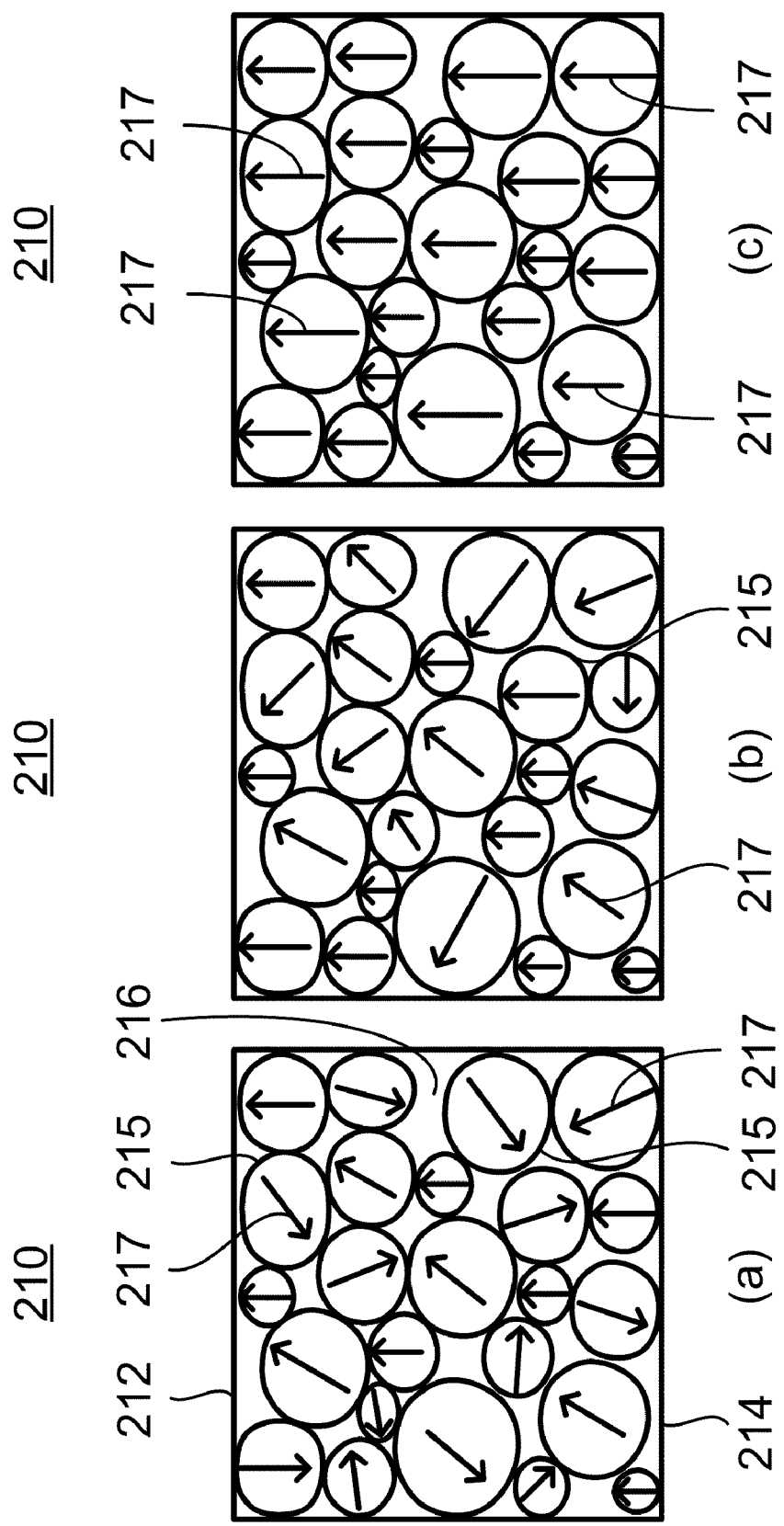
FIG. 2 illustrates schematically the alignment of the domains in a ferroelectric where (a) illustrates unpoled, random orientation, with each domain consisting of a large number of unit cells that would be similarly oriented within that individual domain; (b) illustrates a substantially poled material where the dipoles are oriented in the same overall direction; and (c) illustrates an ideal, completely poled ferroelectric that is generally attained only under special conditions pertaining to the crystal structure of the material.

FIG. 2 shows schematically the alignment of the domains 215 in a ferroelectric 210 in the ferroelectric phase, i.e., the temperature of the ferroelectric 210 is lower than the Curie temperature $T_c$ of the ferroelectric 210. The ferroelectric 210 has a first surface 212 and an opposite, second surface 214 defining a ferroelectric layer body 216 there between. The ferroelectric layer body 216 is characterized with a plurality of domains 215 having a large number of unit cells. As shown in FIG. 2(*a*), each domain 215 is characterized by a spontaneous polarization indicated by a dipole arrow 217, but randomly orientated so that there is no overall net spontaneous polarization in the ferroelectric 210. FIG. 2(*b*) shows the dipoles 217 aligned towards the same overall direction, so that a very powerful net spontaneous polarization exists in the ferroelectric 210. Such alignment can be achieved by applying a poling field to the ferroelectric layer body 216. FIG. 2(*c*) illustrates an ideally aligned ferroelectric that generally is attained only under special conditions pertaining to the crystal structure of the material.

Figure 3:
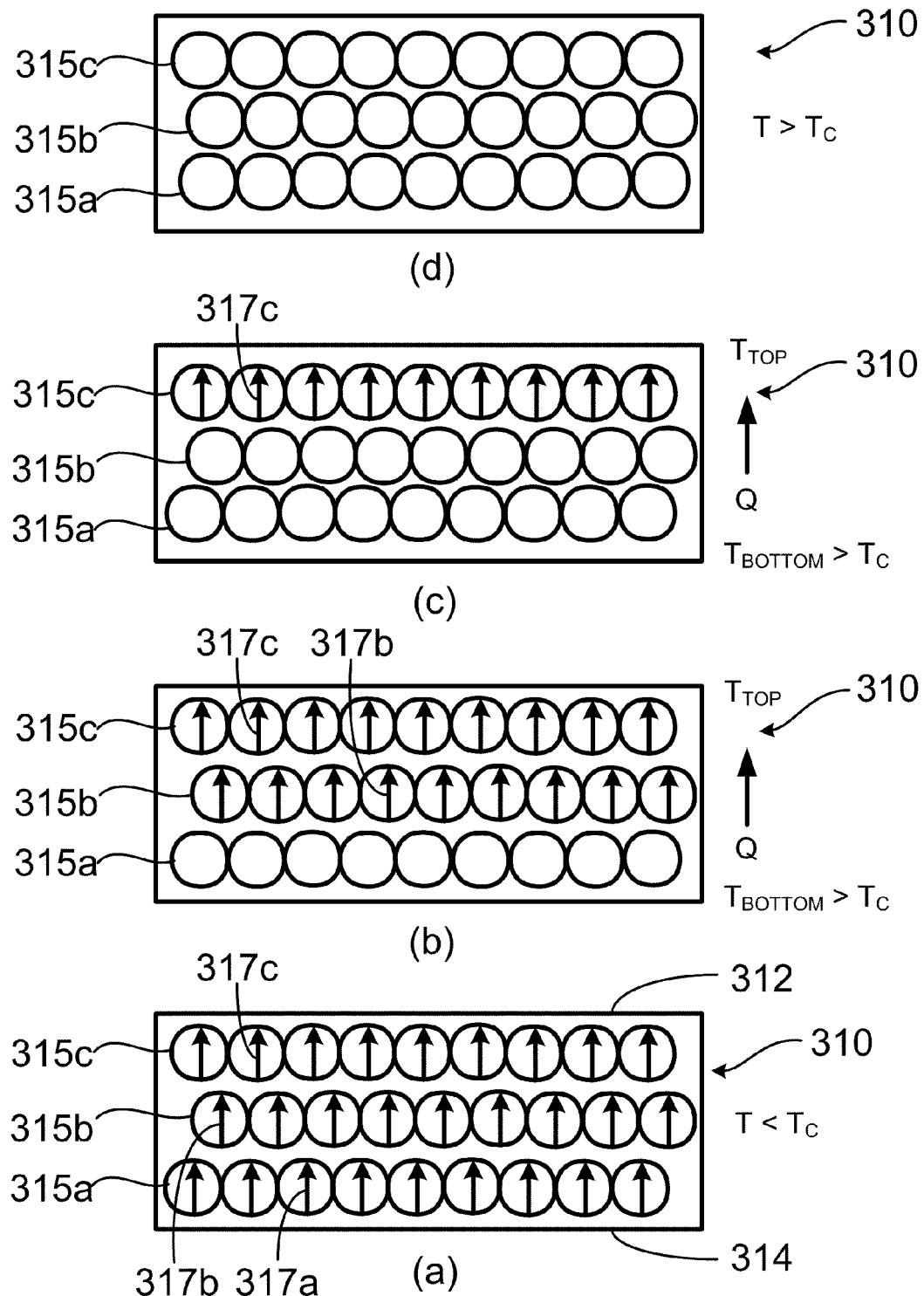
FIG. 3 illustrates schematically (a) a ferroelectric material at a temperature $T<T_c$ in the ferroelectric state where the ferroelectric material is poled and the domains are aligned; (b) the beginning of the transition to the paraelectric state as initially the temperature rises past $T_c$ only in the bottom portion of the ferroelectric material; (c) the phase transition continuing as heat is absorbed and the temperature continues to rise, with the highest temperature at the heat source at the bottom; and (d) the ferroelectric material in the completely paraelectric state where $T>T_c$ throughout.

FIG. 3 shows schematically the progressive disappearance of the net spontaneous polarization of a ferroelectric layer 310 as it transitions from the ferroelectric phase to the paraelectric phase as heat is absorbed and the temperature of the ferroelectric material increases to, and beyond, the Curie temperature, $T_c$. The dipoles and domains are depicted as perfectly aligned for simplicity of illustration. For the purpose of illustration, the ferroelectric layer 310 is characterized with three rows of domains 315*a*, 315*b* and 315*c*, where the domain row 315*a* and the domain row 315*c* are located proximal to the bottom surface 314 and the top surface 312 of the ferroelectric layer 310, respectively, while the domain row 315*b* is located between the domain row 315*a* and the domain row 315*c*, i.e., in the middle of the ferroelectric layer 310. FIG. 3(*a*) shows the ferroelectric layer 310 in the ferroelectric phase where the temperature T of the whole ferroelectric layer 310 is lower than the Curie temperature $T_c$, and each domain 315*a*/315*b*/315*c* has a spontaneous polarization indicated by a dipole 317*a*/317*b*/317*c*. When the ferroelectric layer 310 is heated by a flow of heat Q from the bottom surface 314 so that the temperature $T_{BOTTOM}$ at the bottom surface 314 is higher than the Curie temperature $T_c$, the spontaneous polarization of each domain 315*a* in the domain row 315*a* proximal to the bottom surface 314 disappears, as shown in FIG. 3(*b*). The transition to the paraelectric phase continues as the temperature further increases across the ferroelectric layer 310, as shown in FIG. 3(*c*). In the case, the spontaneous polarization of each domain 315*a*/315*b* in the domain rows 315*a* and 315*b* disappears. When the entire ferroelectric layer 310 is heated to a temperature $T>T_c$, all of the ferroelectric material becomes paraelectric and the spontaneous polarization disappears in each domain 315*a*/315*b*/315*c* in the domain rows 315*a*, 315*b* and 315*c*.

Figure 4:
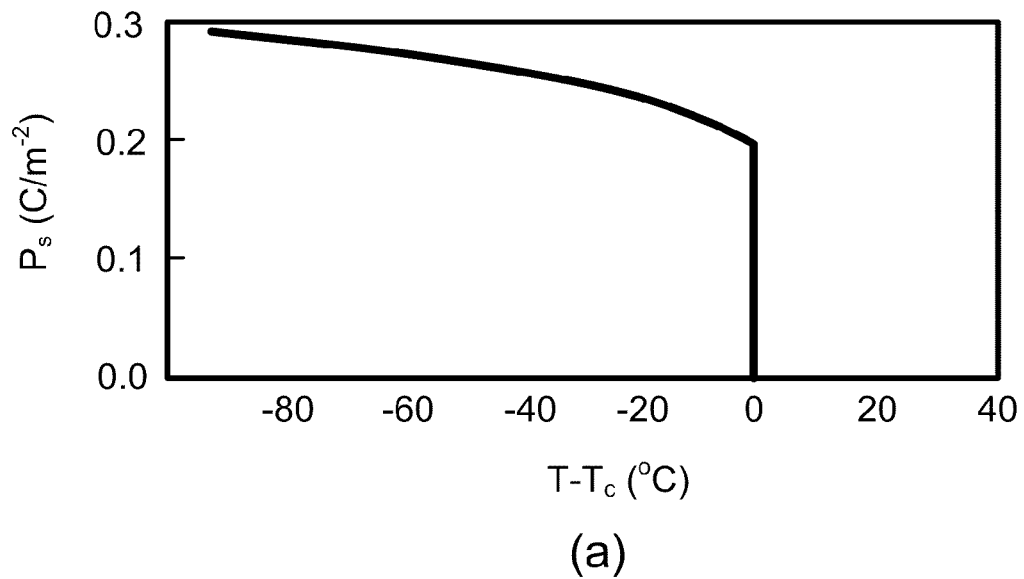
FIG. 4 shows (a) the theoretical relationship between spontaneous polarization, $P_s$, measured in coulombs per m$^2$, and $T_c$ for a first order transition as the temperature approaches $T_c$ and the material undergoes phase transition to paraelectric; and (b) the spontaneous polarization as a function of temperature, as the temperature T approaches $T_c$, for a second-order phase transition ferroelectric material.
Figure 4:
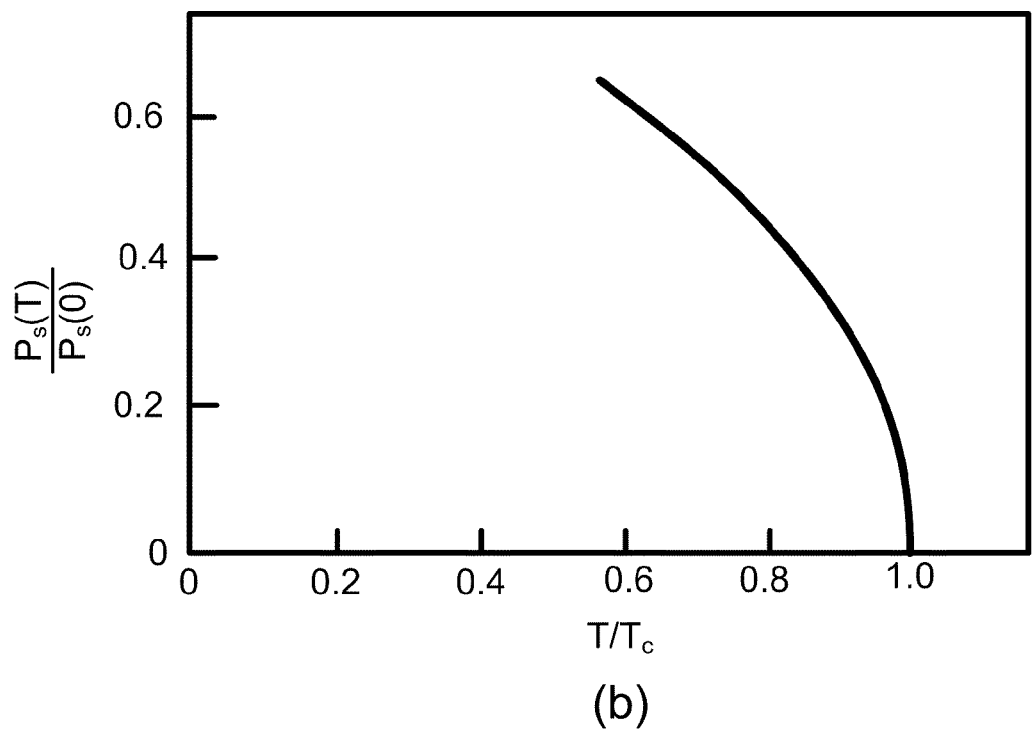

Referring to FIG. 4, the temperature characteristics of the spontaneous polarization of a ferroelectric material are shown quantitatively. FIG. 4(*a*) presents values of spontaneous polarization as a function of temperature calculated using the parameters for the Perovskite ferroelectric barium titanate. The graph illustrates the theoretical relationship between polarization and temperature for a first order transition. FIG. 4(*b*) illustrates spontaneous polarization as a function of temperature, as T approaches $T_c$, for a second-order phase transition ferroelectric material.

Figure 5:
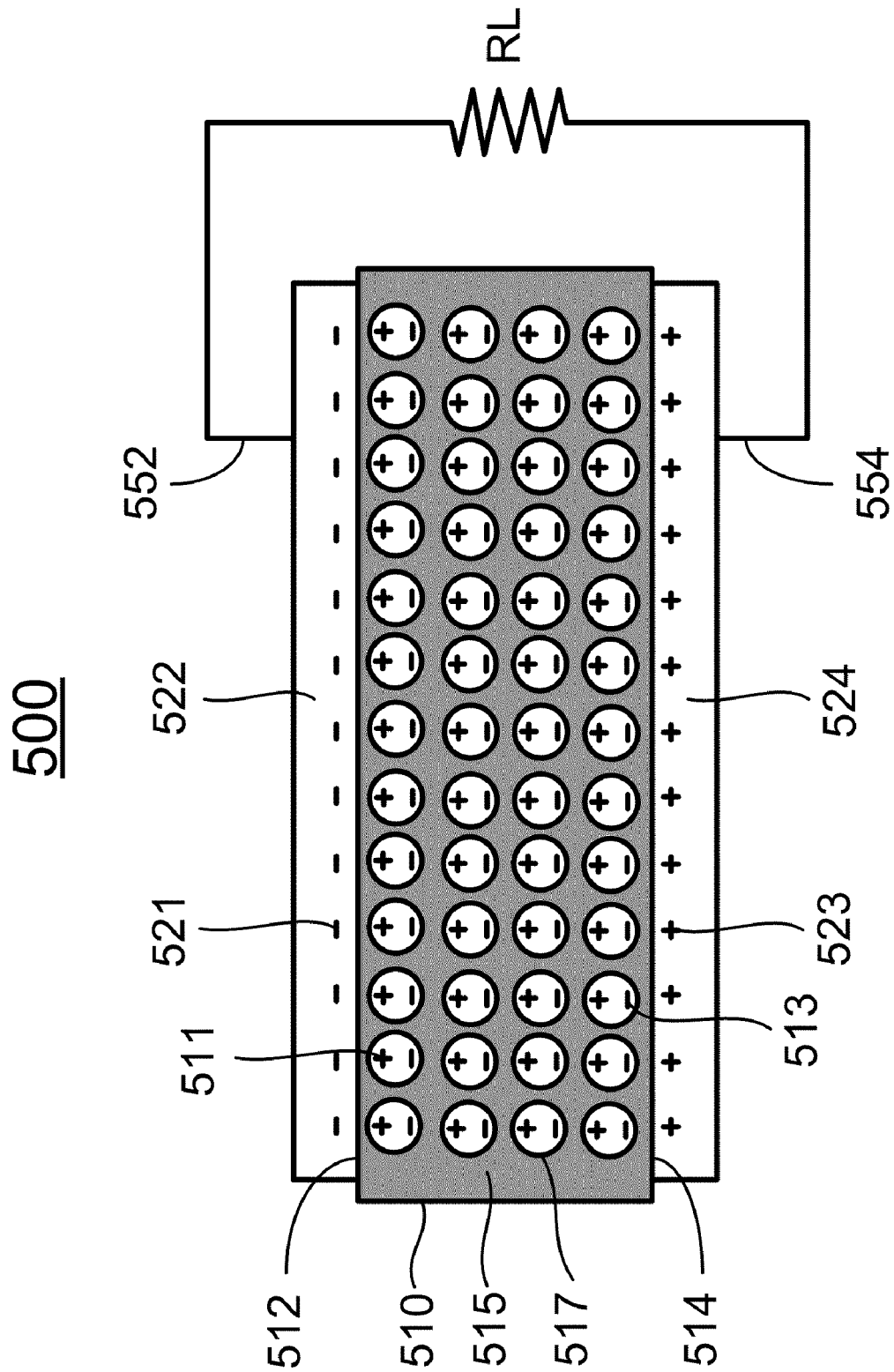
FIG. 5 illustrates schematically bound charges on the surfaces of a ferroelectric structure/layer and the opposing screening charges that are induced on the adjacent surfaces of the electrodes when there is substantial net spontaneous polarization, $P_s$, denoted as $P_r$ in the absence of an external field.

FIG. 5 shows schematically a ferroelectric module 500 in the ferroelectric phase with bound surface charges generated on the surfaces of the ferroelectric layer 510 and corresponding screening charges generated on the electrodes 522 and 524. In the exemplary embodiment, the electric dipoles 517 are aligned, for example, by a small poling field, thereby enabling a large overall net spontaneous polarization to occur in the ferroelectric layer 510. The resulting large net spontaneous polarization produces very dense bound charges 511 and 513 on the surfaces 512 and 514 of the ferroelectric layer 510. As a result, a current flows to the electrodes 522 and 524. Screening charges 521 and 523 are thereby produced on the electrodes 522 and 524 that equal, but are opposite in charge to, the bound charges 511 and 513 at the surfaces 512 and 514 of the ferroelectric layer 510. At that point, the net electric field in the electrodes 522 and 524 is necessarily negligible or zero since the electrodes 522 and 524 are conductors. The bound charges 511 and 513 in the ferroelectric layer 510 result from the aligned electric dipoles 517 and $P_s$, while the screening charges 521 and 523 on the electrodes 522 and 524 result, in turn, from the bound charges 511 and 513, and are in opposition to those bound charges 511 and 513.

As the ferroelectric goes through a phase transition and becomes paraelectric, the spontaneous polarization in the ferroelectric layer 510 disappears. As a result, the screening charges 521 and 523 on the electrodes 522 and 524 become unscreened at an extremely high potential difference between the electrodes 522 and 524, which can serve as a power supply to the load resistor RL. The exact potential difference will depend upon the particular ferroelectric and the configuration of the module, but potentials in excess of 6,000 volts may be attained with appropriate ferroelectrics before dielectric breakdown.

Figure 6:
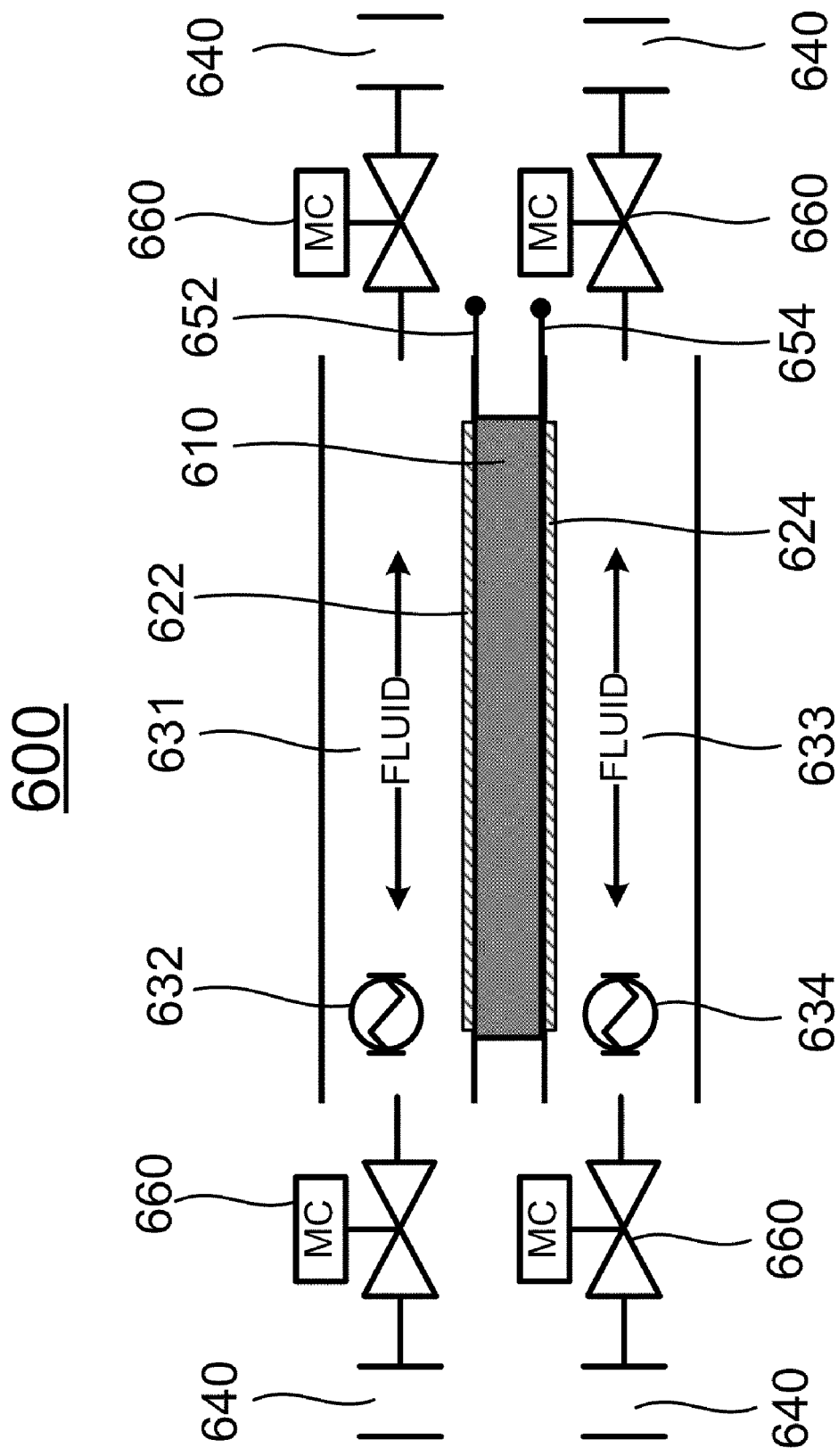
FIG. 6 shows schematically a cross-sectional view of a ferroelectric device for converting heat to electric energy according to another embodiment of the present invention.
Figure 7:
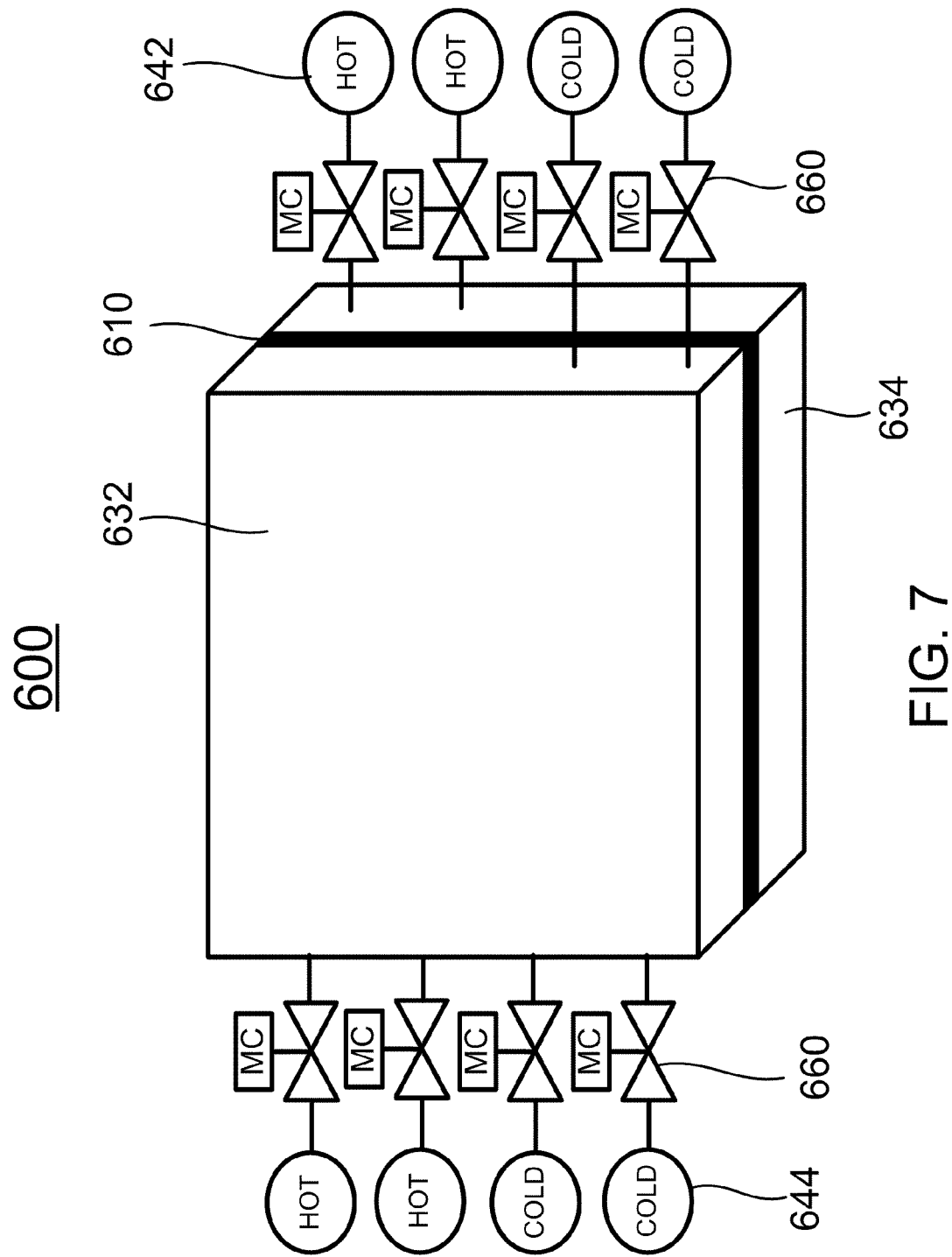
FIG. 7 shows a perspective view of the ferroelectric device as shown in FIG. 6.

FIGS. 6 and 7 show another embodiment of a heat-to-electric conversion device 600 according to the present invention. In the exemplary embodiment, the device 600 has a ferroelectric layer 610, a pair of electrodes 622 and 624 respectively positioned on the surfaces of the ferroelectric layer 610, and a delivering means in relation to the pair of electrodes 622 and 624 for alternately delivering a flow of cold fluid and a flow of hot fluid so as to alternately cool the ferroelectric layer 610 at a first temperature $T_L<T_c$, and heat the ferroelectric layer 610 at a second temperature $T_H>T_c$; thereby the ferroelectric material of the ferroelectric layer 610 undergoes alternating phase transitions between the ferroelectric phase and the paraelectric phase with temperature cycling.

As shown in FIG. 6, the delivering means has a first fluid passage 631 and a second fluid passage 633 positioned on the pair of electrodes 622 and 624, respectively, a number of heat exchangers 632 and 634 including the first and second fluid passages 631 and 633, and a plurality of control valves 660 in communication with the heat exchangers 632 and 633.

The first fluid passage 631 and the second fluid passage 633 are configured such that when a flow of cold fluid passes through at least one of the first and second fluid passages 631 and 633, the ferroelectric layer 610 is cooled towards the first temperature $T_L$, and when a flow of hot fluid passes through at least one of the first and second fluid passages, the ferroelectric layer is heated towards the second temperature $T_H$. The flow of cold fluid and the flow of hot fluid are supplied from a heat sink 644 and a heat source 642, respectively, through, for example, a conduit 640.

The heat exchangers 632 and 634 are adapted for alternately delivering the flow of cold fluid and the flow of hot fluid over the ferroelectric layer 610 so as to alternately cool the ferroelectric layer 610 at a first temperature $T_L$, and heat the ferroelectric layer 610 at a second temperature $T_H$. The plurality of control valves 660 is adapted for controlling the flow of cold and hot fluids in order to cycle the ferroelectric modules around their respective transition temperatures. The plurality of control valves 660, controlled by microcontrollers, are connected to thermocouples in the heating and cooling fluids and attached to the ferroelectric, and the temperature and other data such as the capacitance of the ferroelectric may be used to control the opening and closing of the control valves 660.

Figure 8:
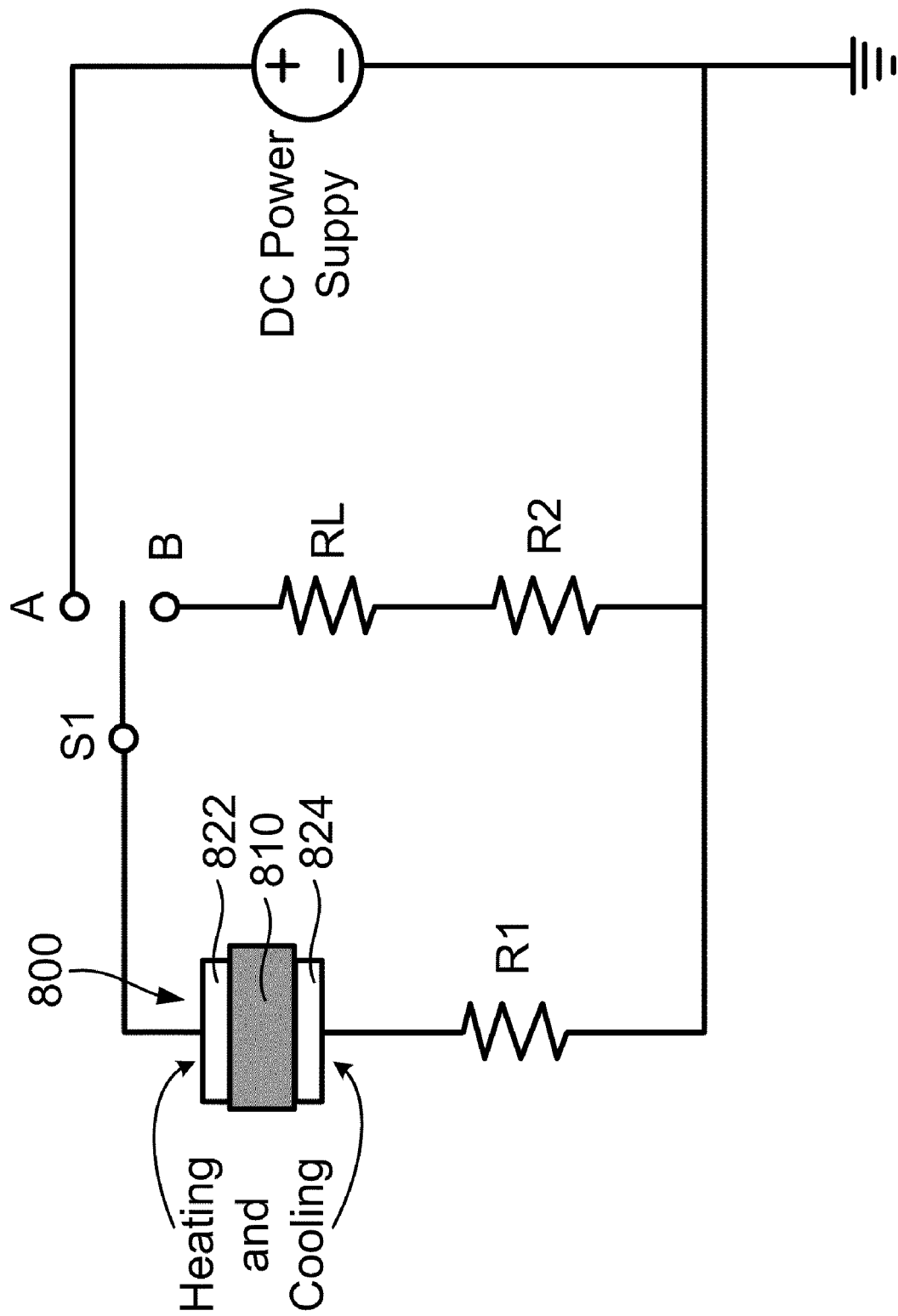
FIG. 8 shows schematically a ferroelectric power generator for operation with a resistive load according to one embodiment of the present invention.

FIG. 8 illustrates schematically a heat-to-electric energy conversion device 800 connected to a DC power supply (voltage source) for poling, and to an external resistance, RL, for receiving the electrical discharge generated, according to one embodiment of the present invention. Additionally, the current generated from the electrical discharge is monitored by resistors R1 and R2. In operation, with switch S1 in position A, a DC voltage from the DC power supply is applied across the ferroelectric layer 810 as it is cooled at and below the phase transition temperature $T_c$. The purpose of the DC voltage is to pole the electric dipoles in the ferroelectric layer 810 to the extent permitted by the crystal structure of the material system. When the ferroelectric layer 810 cools to $T<T_c$ so that the material becomes ferroelectric, large amounts of electrical energy are stored spontaneously. The tremendous overall net spontaneous polarization that occurs in the ferroelectric layer as a whole would not occur without such poling. The voltage required for poling is material dependent, but is small compared to the voltage at which the charge is discharged from the ferroelectric device 800. For that reason, the net electrical work output during discharge is much greater than the electrical work input during poling. While the ferroelectric layer 810 may be poled after it has been cooled to $T_L$, it may be desirable to pole while the ferroelectric layer 810 is cooling so that (1) cycling will be faster and (2) poling will occur immediately during the ferroelectric phase transition, rather than at a lower temperature than $T_c$. A somewhat weaker electric field generally will suffice to pole when poling is done most closely to the phase transition temperature. Although the electrical energy required for poling will generally be small compared to the energy removed during discharge, some additional efficiency may thus be achieved by poling in this manner during cooling and phase transition. Other than the minimum required for poling, a voltage is not applied across the ferroelectric layer 810.

When the switch S1 is in position B, the ferroelectric device/module 800 is ready for heating so as to discharge electrical energy to the load RL. As the electrical charges are removed from the electrodes 822 and 824, the charges are received, through conductive leads connected to the electrodes 822 and 824, at a very high voltage by the load resistor, RL, or by any other suitable device that can be used to store, transmit, or utilize electricity for work. In accordance with general principles of power generation, the ferroelectric module 810 will generate electric power most effectively when the impedance of the module is matched to the impedance of the load resistance.

In practice, the cycling of the ferroelectric modules 600 and 800 are repetitive and ongoing so long as the device is to be used to generate electricity from heat. Thus, a description of the cycle could begin at any point in the cycle. For the purpose of illustrating the operation of the device, the ferroelectric module 600 or 800 is initially assumed to be in the paraelectric phase.

The thermal cycling and the electrical inputs and outputs are controlled by microcontrollers. Different levels of control, as may be appropriate depending on the application, can be obtained by using microcontrollers in combination with computers. The microcontrol valves that regulate the flow of heating and cooling fluids to the ferroelectrics are illustrated in FIGS. 6 and 7. The microcontrollers receive the temperature values from thermocouples that monitor the temperature in the heating and cooling fluids and in the ferroelectric materials, and the polarization and load currents as measured by resistors R1 and R2, respectively, as shown in FIG. 8. These microcontrollers control the heat exchangers to cause appropriate thermal cycling of the ferroelectric module in accordance with the operational cycle. Microcontrollers that receive such monitoring data also direct the position of the switch 51 to control whether the poling voltage is applied and whether the circuit is configured to permit the discharge of electricity from the ferroelectric module into the external circuitry. Instead of or in addition to thermocouples, capacitance measurements of one or more control ferroelectrics may be used as monitors and to control the timing of the cycling and switching.

In the paraelectric phase (stage 1), no external electric field is applied to the device 800. The ferroelectric layer 810 has been heated at that point such that the temperature $T>T_c$ and the spontaneous polarization in the ferroelectric material is negligible or zero. The electric dipoles at the unit cell level have then disappeared. The screening charges have been removed, and the electric field and current flow between the electrodes is then negligible.

At that point, the ferroelectric module 800 undergoes the controlled actions. The temperature cycling in stage 2 is the cooling of the ferroelectric material so that it transitions from the paraelectric phase to the ferroelectric phase. That is accomplished by microcontrollers that cause the heat exchangers to direct a cooling fluid to the ferroelectric module 800. Heat is thereby withdrawn from the ferroelectric until it is cooled to the point where the temperature $T<T_c$ and the material undergoes a phase transition to the ferroelectric phase.

During that cooling process, a small electric field is applied to the ferroelectric from the DC power supply as shown in FIG. 8 in order to pole the ferroelectric material, as described above. The DC voltage to create that poling field depends upon the particular material, its thickness, and whether the device is operated in a single or multi-stage configuration, but for a single stage, lead-based ceramic ferroelectric of approximately 1.0 mm thickness, the poling field may be produced, for example, by application of approximately 200 volts. Without such poling, the unit cells would spontaneously exhibit electric dipoles when the material is in the ferroelectric phase but, in the overall aggregate, the unit cell dipoles would not be aligned. Such alignment is essential to achieve the extremely high overall $P_s$ values that are exploited by the invention. Once the minimum voltage necessary to achieve appropriate poling has been applied, the voltage is discontinued. An applied voltage is not otherwise imposed during the cycle.

Poling aligns the electric dipoles to the extent permitted by the crystal structure of the material system. The resulting overall inherent spontaneous polarization, $P_s$, produces very large bound charges on the surfaces of the ferroelectric. As a result, a current flows to the electrodes 822 and 824 that are positioned on the opposite sides of the ferroelectric material. Screening charges are thereby produced on the electrodes that equal, but are opposite in charge to, the bound charges at the surfaces of the ferroelectric layer 810. At that point, the net electric field in the electrodes is negligible or zero since the electrodes are conductors. FIG. 5 illustrates (1) the bound charges in the ferroelectric that are the result of the aligned electric dipoles and $P_s$ and (2) the screening charges that arise on the electrodes in opposition to those bound charges.

The operation of the ferroelectric module 800 then proceeds to stage 3, heating to the paraelectric phase and discharging the electric charges from the electrodes 822 and 824. That is accomplished by the microcontrollers that control the heat exchangers initiating heating of the ferroelectric material. The ferroelectric is heated by the transport of thermal energy from the heat exchangers, for example through application of a heating fluid, until such time as the temperature $T>T_c$ and the material becomes paraelectric. As the ferroelectric layer 810 is heated, the switch S1 is switched to position B. As such, the load resistor RL is in the circuit with the ferroelectric module 800. R1 and R2 may remain in the circuit to continue to monitor the current, since they have negligible resistance compared to the load resistance RL.

As the ferroelectric goes through phase transition and becomes paraelectric, the spontaneous polarization disappears. As a result, the screening charges on the electrodes 822 and 824 become unscreened at an extremely high potential difference. The exact potential difference will depend upon the particular ferroelectric and the configuration of the module, but potentials in excess of 6,000 volts may be attained with appropriate ferroelectrics before dielectric breakdown. With the switch S1 in position B, the now unscreened charges on the electrodes 822 and 824 discharge at very high voltage through the conductive leads connected to the electrodes 822 and 824 to the load resistor or any such other electric load that may be desired.

That completes the cycle, which is now back to the paraelectric phase after full heating of the ferroelectric layer 810 to the temperature $T>T_c$; completion of electrical discharge; and extraction of the electrical energy that was generated and stored in the ferroelectric. The energy and power densities generated depend on the specific ferroelectric material used. As described below, a particular commercially available PZT that is not fabricated for optimal power generation yields energy densities of about 3 kJ/L per cycle according to the present invention. There is a great variety of ferroelectrics that may be used with the invention, as particular materials families are subject to virtually endless variation to optimize their performance. Based on reported characteristics, materials systems in some of the basic ferroelectric families will have power densities ranging from about 1 to 7 kW/kg with a 1 Hz cycle speed. Examples include: $Na(NO_2)$ [6 kW/kg]; PVDF [7 kW/kg]; $PbTiO_3$ [1.6 kW/kg]; $(NH_4)_2SO_4$ [0.9 kW/kg]; $KNO_3$ [4.7 kW/kg]; $PbCa_2(C_2HbCO_2)_6$ [0.5 kW/kg]; PZT [1 kW/kg]; PLT [1 kW/kg]. It is not suggested that these are maximum power densities that may be achieved using the invention. Power densities will depend upon the particular ferroelectric module; the characteristics of the heat source and heat sink; and the cycling efficacy of the heat exchangers as a means of rapidly and efficiently heating and cooling the ferroelectric.

Figure 9:
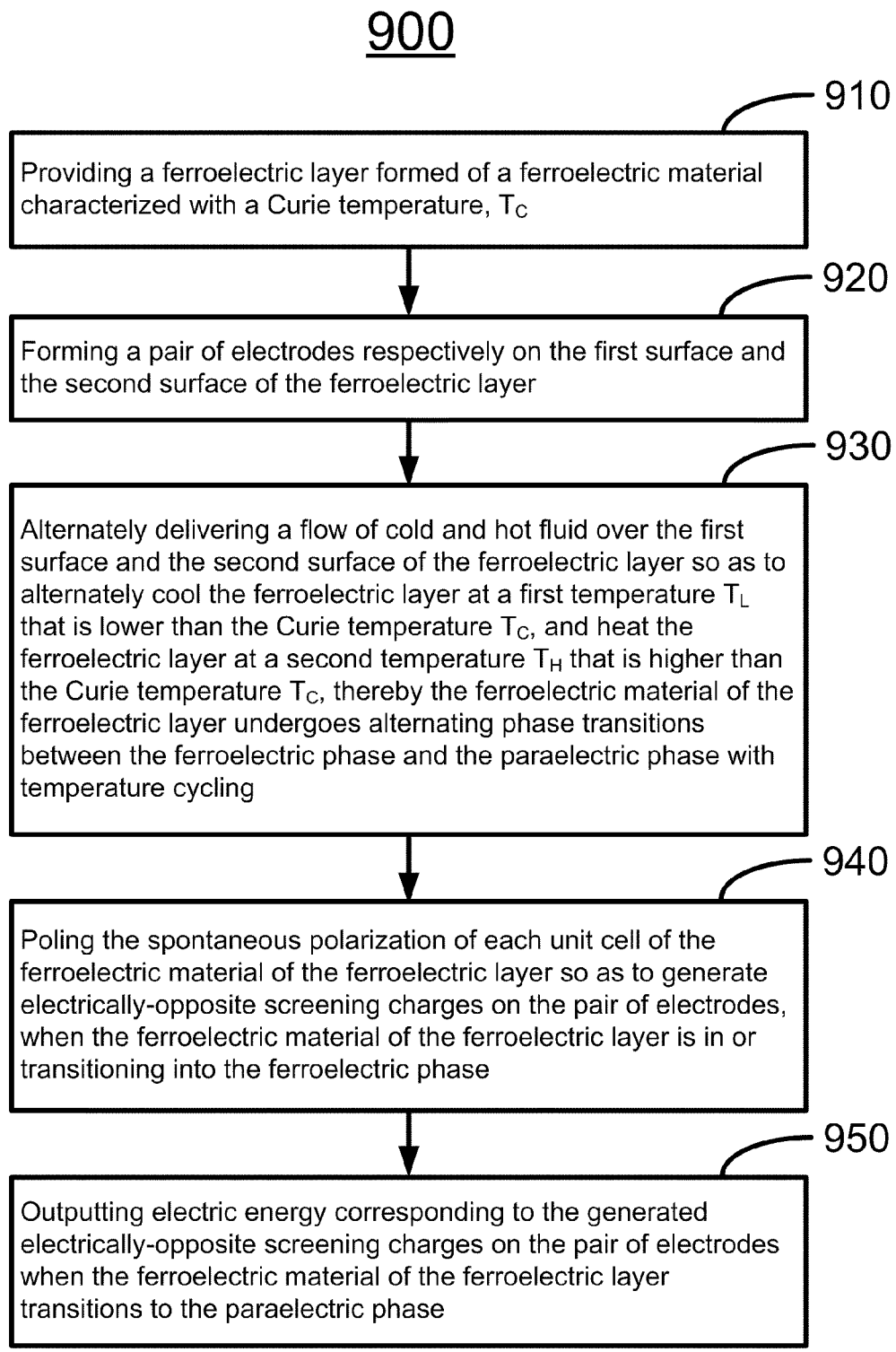
FIG. 9 is a flow chart of a process for converting heat to electric energy according to one embodiment of the present invention.

Referring to FIG. 9, a method 900 for operating the invented device for converting heat to electrical energy is shown according to one embodiment of the present invention. In one embodiment, the method 900 includes the following steps: at step 910, a ferroelectric layer is provided. The ferroelectric layer is formed of a ferroelectric material characterized with a Curie temperature, $T_c$. When the temperature of the ferroelectric material is lower than the Curie temperature $T_c$, the ferroelectric material is in a ferroelectric phase in which spontaneous polarization is established in the unit cells of the ferroelectric material; when the temperature of the ferroelectric material is greater than the Curie temperature $T_c$, spontaneous polarization is not established in the unit cells of the ferroelectric material.

At step 920, a pair of electrodes is formed respectively on the first surface and the second surface of the ferroelectric layer. The pair of electrodes is formed of a thermally and electrically conductive material.

At step 930, a flow of cold fluid and a flow of hot fluid are alternately delivered over the first surface and the second surface of the ferroelectric layer so as to alternately cool the ferroelectric layer at a first temperature $T_L$ that is lower than the Curie temperature $T_c$, and heat the ferroelectric layer at a second temperature $T_H$ that is higher than the Curie temperature $T_c$, thereby the ferroelectric material of the ferroelectric layer undergoes alternating phase transitions between the ferroelectric phase and the paraelectric phase with temperature cycling. As set forth above, the flow of cold fluid and the flow of hot fluid can alternately be delivered by heat exchangers, control valves, or the likes.

At step 940, when the ferroelectric material of the ferroelectric layer is in or transitioning into the ferroelectric phase, the spontaneous polarization of the unit cells of the ferroelectric material of the ferroelectric layer is poled so as to generate electrically-opposite screening charges on the pair of electrodes. In one embodiment, the poling is performed by applying a small external field to the ferroelectric layer so as to align the dipoles of the unit cells.

At step 950, when the ferroelectric material of the ferroelectric layer transitions into the paraelectric phase, electric energy corresponding to the generated electrically-opposite screening charges on the pair of electrodes is output to an external circuitry at a very high voltage.

It should be noted that, while the essential function of the device occurs in a single layer with a given ferroelectric material, the invention generally will be more useful in practical applications and will produce greater quantities of electrical energy from a particular heat source where a number of ferroelectric materials are combined in a series of stages. In some applications where the temperature difference between the heat source and the heat sink is small, a single layer may be appropriate. While that situation allows a less robust opportunity for conversion of heat to electricity, that is an unavoidable consequence of the Second Law of Thermodynamics, which dictates that the maximum efficiency that can be achieved by any system that converts thermal energy to another form of energy, or to work, is prescribed by the Carnot efficiency: $\eta_c = \Delta T/T_H$. In applications where $\Delta T$ is larger, it will generally be desirable to utilize a multistage conversion module that includes a series of ferroelectric materials with a succession of phase transition temperatures that correspond to the available temperatures between $T_H$ and $T_L$. The magnitude of $\Delta T$ that warrants multi-stage treatment will vary depending upon the specific application and materials system used.

There are a number of configurations or embodiments whereby the basic principle of the present invention can be used in a format with ferroelectrics that have multiple phase transition temperatures, several of which will be described here. By providing these descriptions, it is not the intention to limit the invention to these configurations, which are merely illustrative.

FIG. 10 shows an apparatus 1000 having a plurality of ferroelectric modules, FM1, FM2, . . . FMn−1 and FMn, arranged in an array to expand the working surface that interfaces with the heat exchangers so as to increase the amount of thermal energy that can be received from the heat source and be converted to electrical energy. The electrical output is removed by buses 1001 connected to the electrodes of each module.

Figure 11:
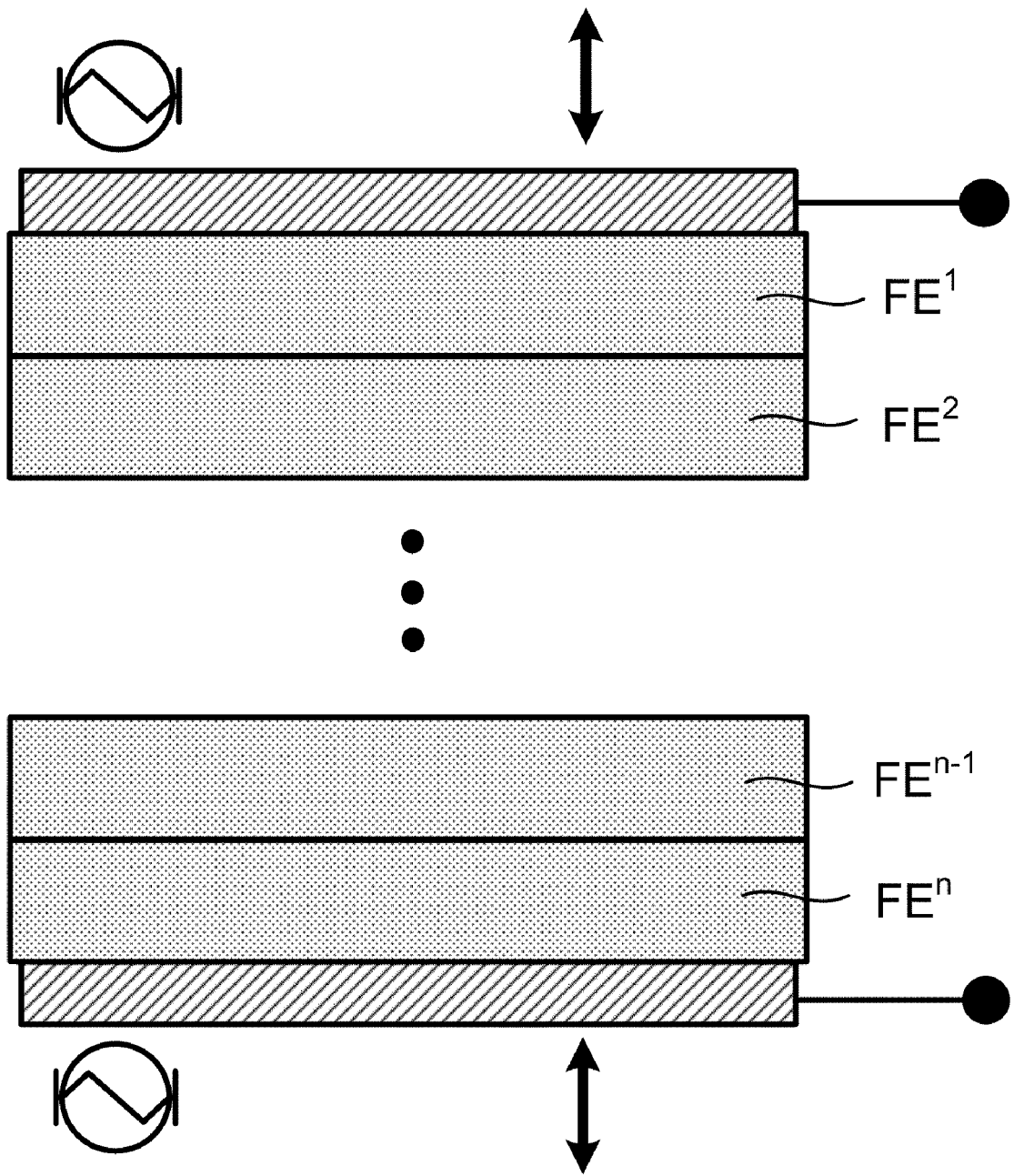
FIG. 11 shows schematically a ferroelectric device for converting heat to electric energy according to another embodiment of the present invention.
Figure 12:
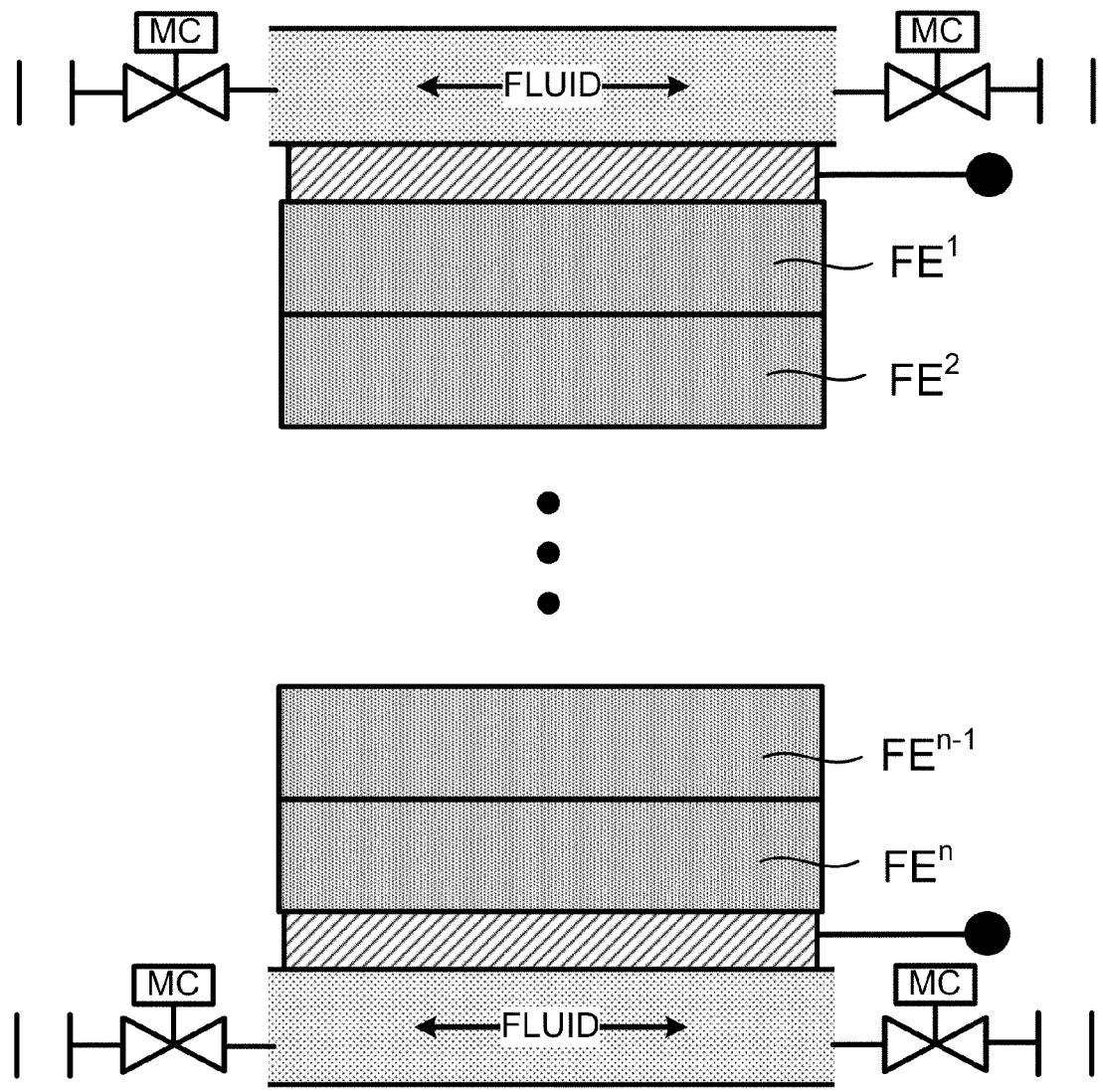
FIG. 12 shows schematically a ferroelectric device for converting heat to electric energy according to yet another embodiment of the present invention.

In a multilayer configuration, a series of ferroelectric layers may be arranged in a stack formed in order to maximize thermal conductivity. The resulting multilayered ferroelectric structure is placed between a pair of electrodes, which is similar to the single layer device as disclosed above. Such a configuration is illustrated diagrammatically by FIGS. 11 and 12. The sequential layers, $FE^1$, $FE^2$ . . . $FE^{n-1}$ and $FE^n$, are formed of an identical ferroelectric material or substantially different ferroelectric materials. The Curie temperatures, $T_c^1$, $T_c^2$ . . . $T_c^{n-1}$ and $T_c^n$, correspond to the ferroelectric materials in the sequential layers $FE^1$, $FE^2$ . . . $FE^{n-1}$ and $FE^n$. In one embodiment, the multilayered ferroelectric materials are arrayed so that $T_c^{i+1} > T_c^i$. The combined multilayer module is then cycled thermally so that each individual layer cycles around its phase transition temperature and each layer, during the course of a cycle, undergoes ferroelectric-paraelectric or ferroelectric-antiferroelectric cycling with poling as described herein. With this multilayer configuration, as shown in FIGS. 11 and 12, the electrical energy removed at high voltage during the discharge leg of the cycle is the result of the total spontaneous polarization, $P_s$, at the junctures of the electrodes and the ferroelectric materials designated as $FE^1$ and $FE^n$, which polarization results from the cumulative spontaneous polarization of each FE layer acting together. As shown in FIGS. 11 and 12, a pair of electric leads is electrically connected to the first and second electrodes, respectively, for applying the DC voltage and the resulting electric field for poling the ferroelectric layer in the ferroelectric phase or during the transition into the ferroelectric phase, and for outputting the electric energy corresponding to the generated electrically-opposite screening charges discharged during the transition into the paraelectric or antiferroelectric phase.

Figure 13:
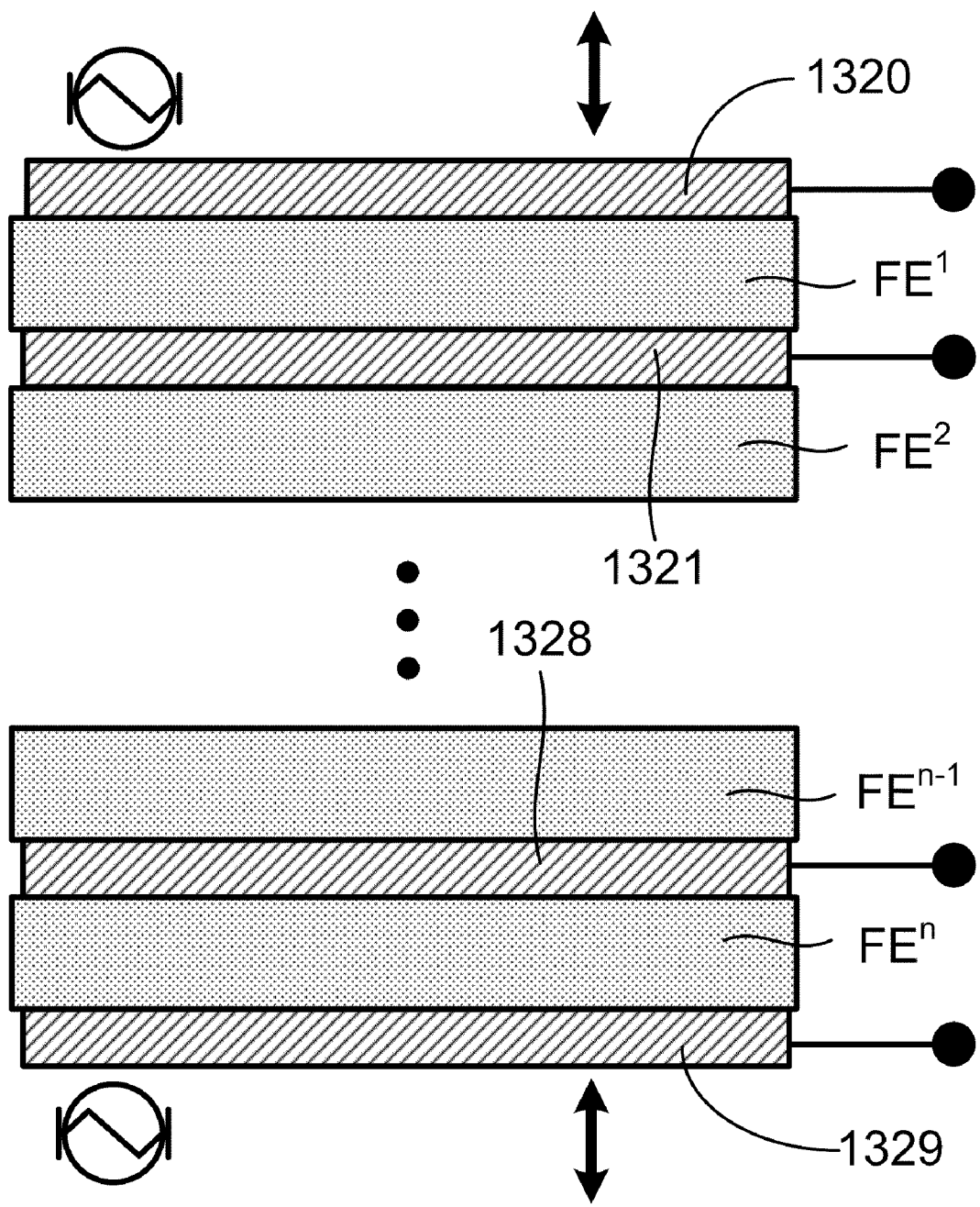
FIG. 13 shows schematically a ferroelectric device for converting heat to electric energy according to an alternative embodiment of the present invention.

Referring to FIG. 13, another embodiment of a multilayered ferroelectric device 1300 is shown according to the present invention. This configuration of the multilayered ferroelectric device 1300 is similar to the device as disclosed in FIG. 11, but separate electrodes are placed between each ferroelectric layer. For example, the ferroelectric layers $FE^1$ and $FE^2$ are separated by the electrode 1321, while the ferroelectric layers $FE^{n-1}$ and $FE^n$ are separated by the electrode 1328. These electrodes 1320, 1321 . . . 1328 and 1329 are formed of a thermally and electrically conductive material. The thermal cycling and operation of the device 1300 are similar to the device as disclosed in FIGS. 11 and 12. However, the extraction/output of the electrical energy from the device is different. In this configuration, the electrical energy is withdrawn/output during the discharge leg of the cycle from all of the electrodes 1320, 1321 . . . 1328 and 1329, as shown in FIG. 13. The electrical energy withdrawn/output from the electrodes 1320, 1321 . . . 1328 and 1329 can then either be transported via the connective leads to a load resistance or to a bus for exportation to such external circuitry and use as may be desired.

Figure 14:
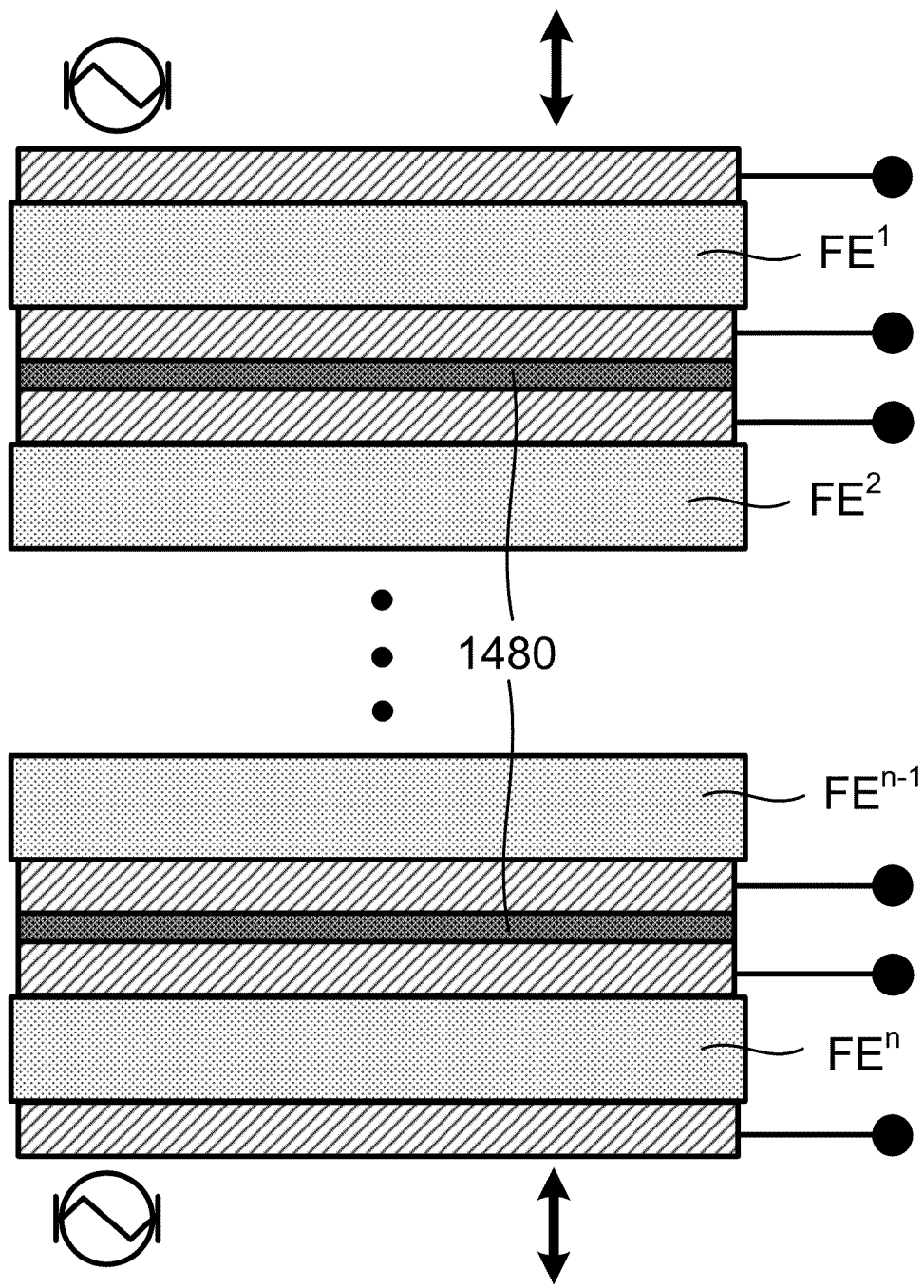
FIG. 14 shows schematically a ferroelectric device for converting heat to electric energy according to a further embodiment of the present invention.

FIG. 14 shows schematically an alternative embodiment of a multilayered ferroelectric device 1400. This configuration of the multilayered ferroelectric device 1400 is similar to the device as disclosed in FIG. 13, but each ferroelectric layer is separated from the adjacent layer of ferroelectric material by two electrodes which, in turn, are separated by an electrical insulator 1480, which is selected to minimally impede thermal transfer.

Figure 15:
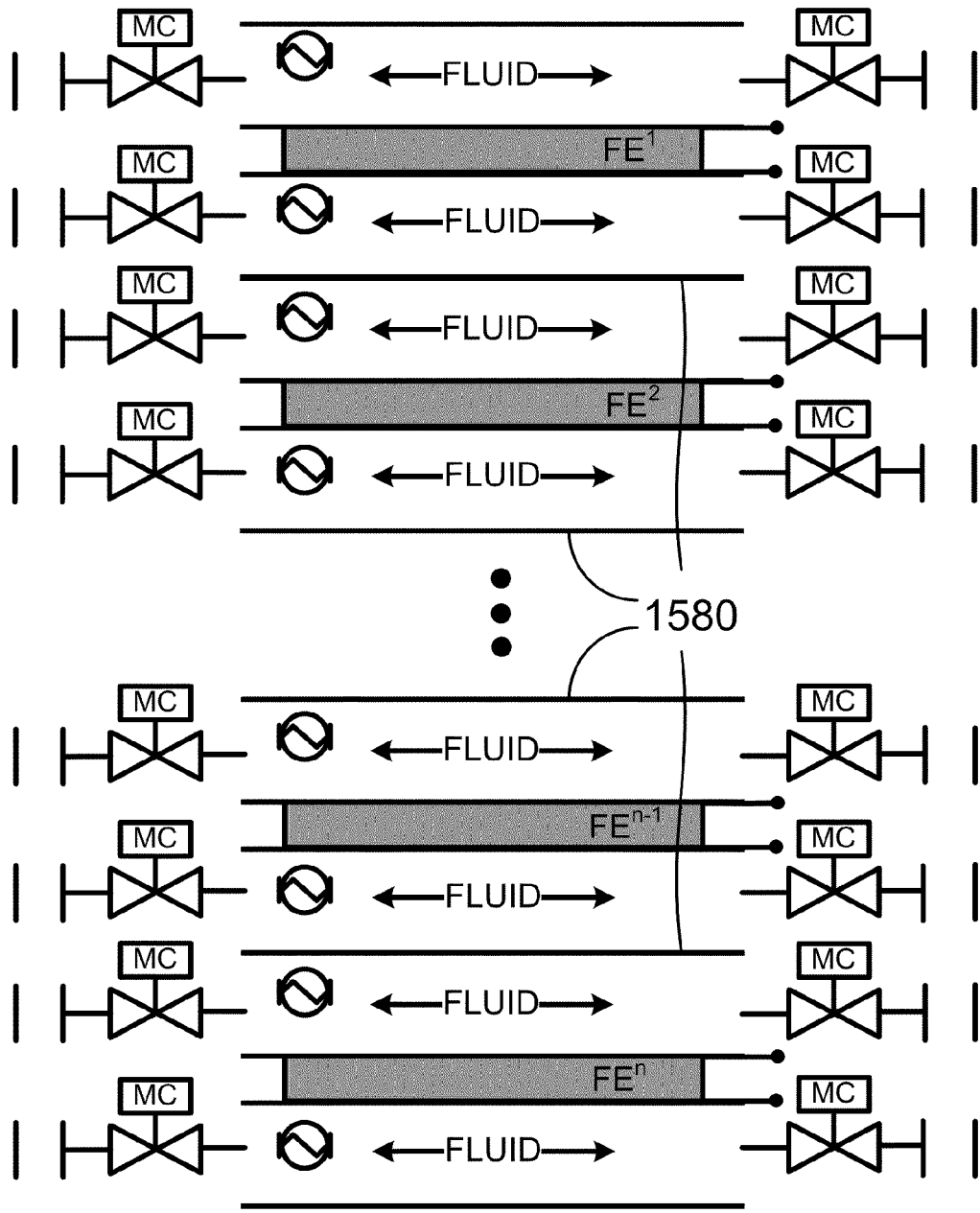
FIG. 15 shows schematically a ferroelectric device for converting heat to electric energy according to yet a further embodiment of the present invention.

FIG. 15 illustrates schematically a system of n individual ferroelectric modules with a series of different phase transition temperatures, $T_c^1$ to $T_c^n$, that lie in an increasing (or decreasing) sequence between the temperatures of the heat source, $T_H$, and the heat sink, $T_L$, and that are operated with a heat exchanger system so as to cycle each ferroelectric stage, $FE^i$, around its respective phase transition temperature, $T_c^i$. In this configuration, the phase transition temperatures vary among different ferroelectric layers $FE^1$, $FE^2$ . . . $FE^{n-1}$ and $FE^n$. As shown in FIG. 15, a series of single-layer devices as shown in FIG. 6 are arranged in a stack. Each single-layer device operates with heat exchangers that selectively heat and cool the individual ferroelectric modules so that the i-th layer is thermally cycled around its respective phase transition temperature, $T_c^i$. In this configuration, the ferroelectric modules are integrated with a networked heat exchanger that cycles each ferroelectric module, $FM^i$, around its transition temperature, $T_c^i$. The heat exchangers may be interconnected to facilitate regenerative heating and cooling or to facilitate operating the ferroelectric modules in cascade with decreasing temperature. Adjacent heat exchangers may be thermally insulated from one another by thermal insulators 1580, as shown in FIG. 15. In this system, thermocouples, as a monitoring means, are located such that the temperature of the heating and cooling fluids is monitored throughout the system, as are the temperatures or capacitance of the ferroelectrics in the individual modules. A system of microcontrollers then directs the heating and cooling fluids at appropriate temperatures to cause each ferroelectric stage, $FE^i$, to cycle around its respective phase transition temperature, $T_c^i$, in the format and method of thermal cycling described herein for a single-stage device. The electrical energy withdrawn/output from the electrodes can then either be transported via the connective leads to a load resistance or to a bus for exportation to such external circuitry and use as may be desired.

Without intent to limit the scope of the invention, exemplary results for the ferroelectric devices according to the embodiments of the present invention are presented in FIGS. 19-26.

Figure 19:
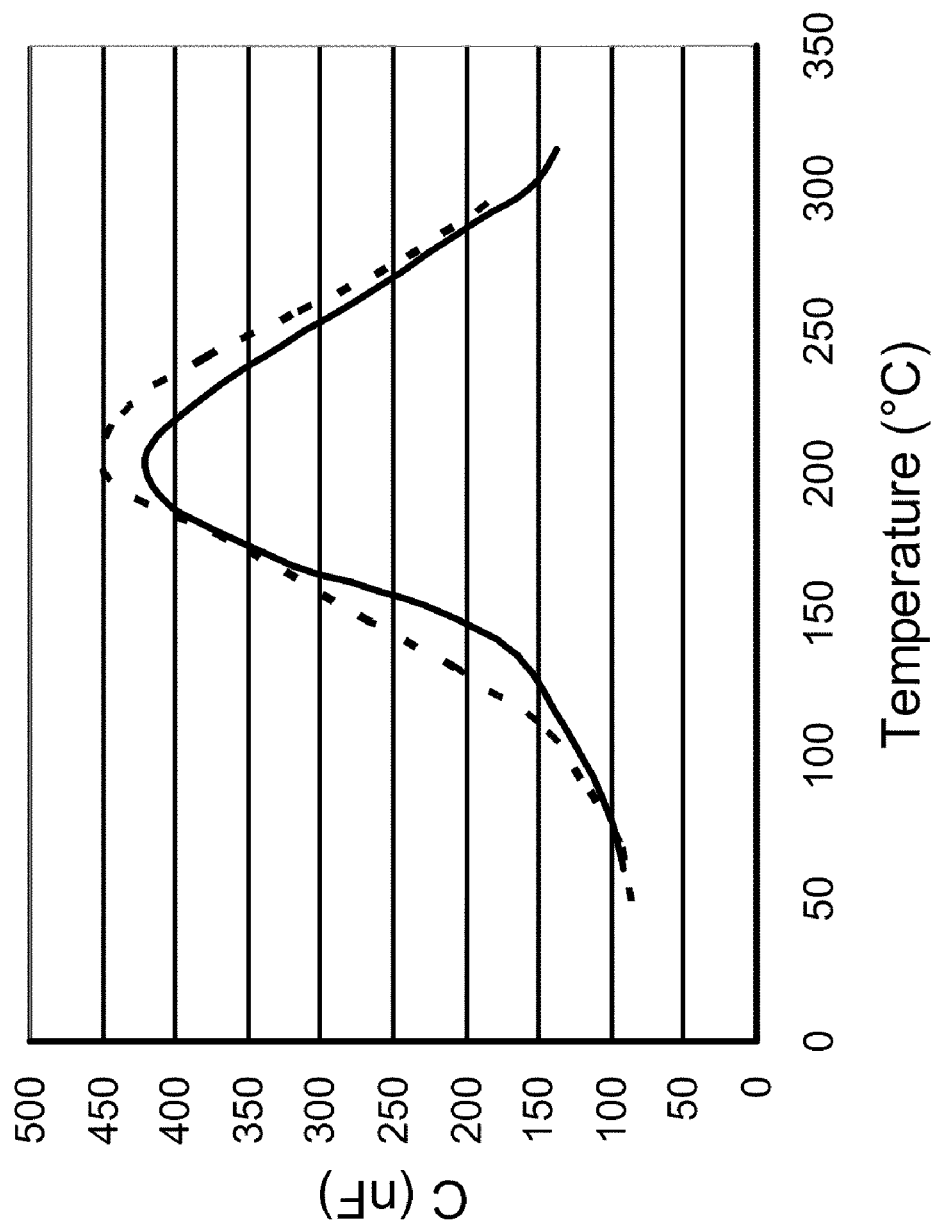
FIG. 19 presents the measured capacitance as a function of temperature for a ferroelectric module of PZT during heating (solid line) and cooling (dashed line) at 1 kHz, where the Curie temperature $T_c$ for the PZT is approximately 180° C.

FIG. 19 is the measured capacitance as a function of temperature for a ferroelectric module of a commercially available PZT during heating (solid line) and cooling (dashed line) at 1 kHz. The Curie temperature $T_c$ for the PZT is approximately 180° C.

Figure 20:
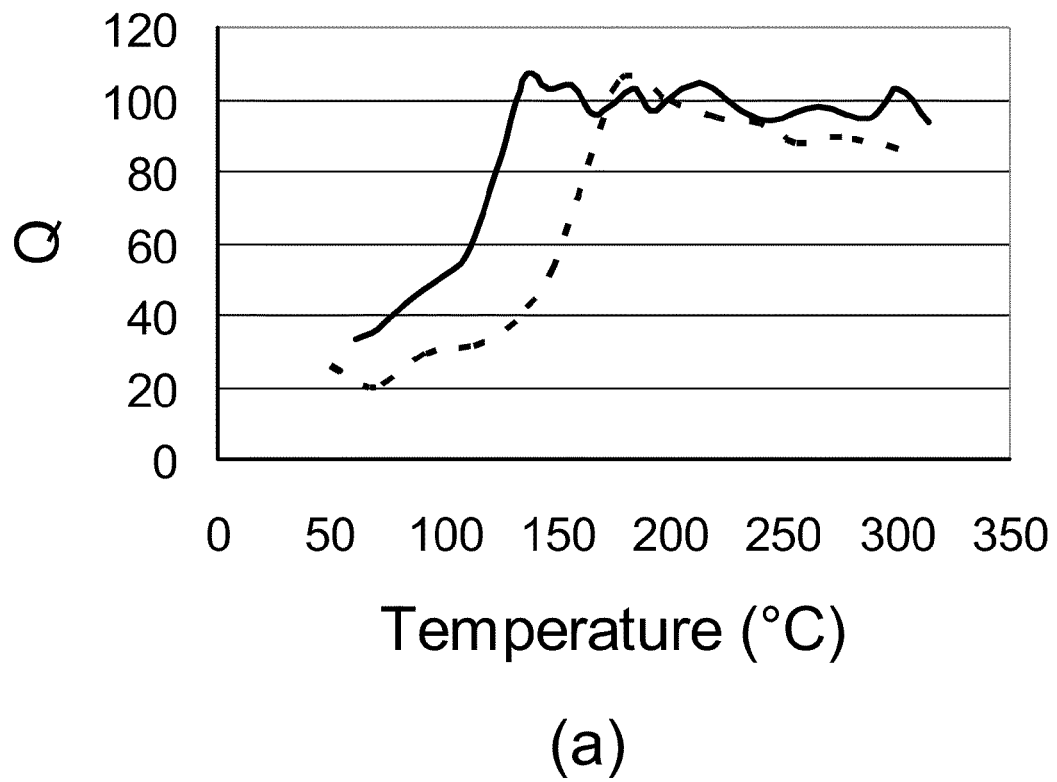
FIG. 20 presents the measured values for (a) the quality factor Q (inverse of the loss tangent) and (b) the sample impedance in kilohms as a function of temperature for a first order transition ferroelectric material of PZT measured at 1 kHz during heating (solid line) and cooling (dashed line)
Figure 20:
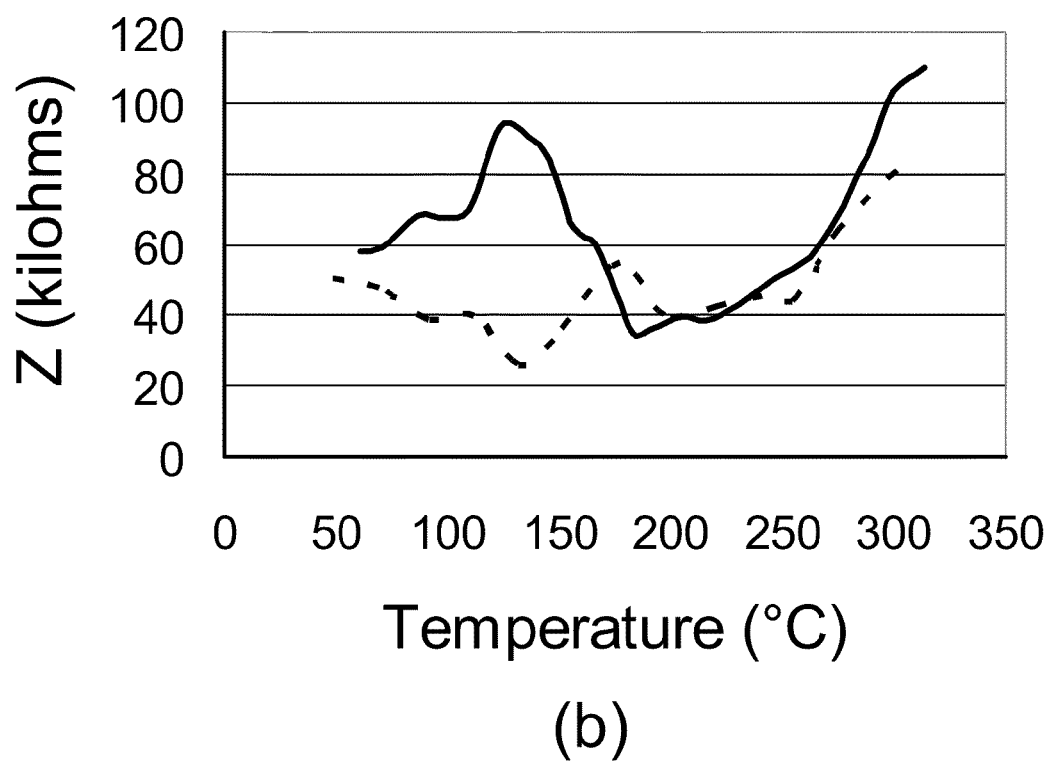

FIG. 20 presents the measured values for (a) the quality factor Q (inverse of the loss tangent) and (b) the sample impedance as a function of temperature for the PZT sample, a first order transition ferroelectric material, during heating (solid line) and cooling (dashed line) at 1 kHz. The Curie temperature $T_c$ of the PZT is approximately 180° C.

Figure 21:
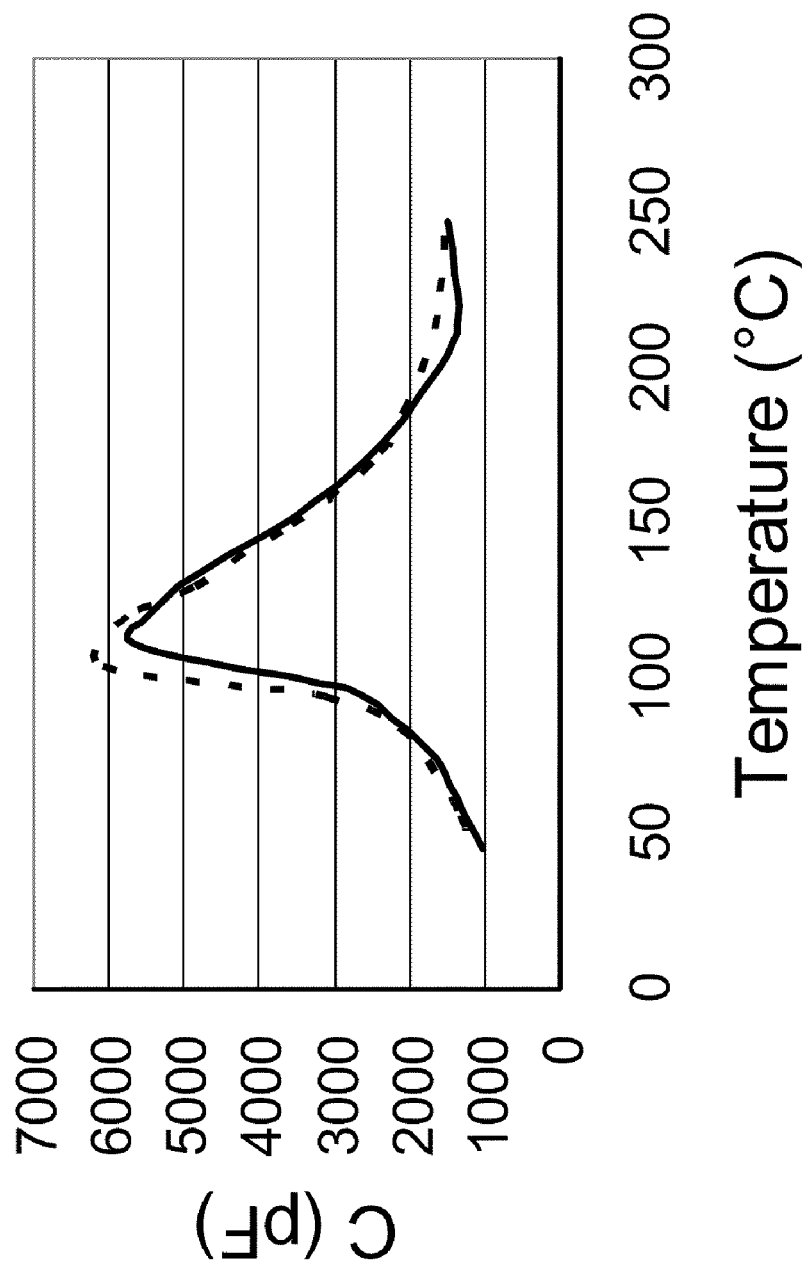
FIG. 21 presents the measured capacitances as a function of temperature for a ferroelectric module of PLT, with the capacitance measured at 1 kHz during heating (solid line) and cooling (dashed line)

FIG. 21 presents the measured capacitances as a function of temperature for a ferroelectric module of PLT, with the capacitance measured during heating (solid line) and cooling (dashed line) at 1 kHz. Note that the transition temperature $T_c$ of the PLT is lower than that of the PZT.

Figure 22:
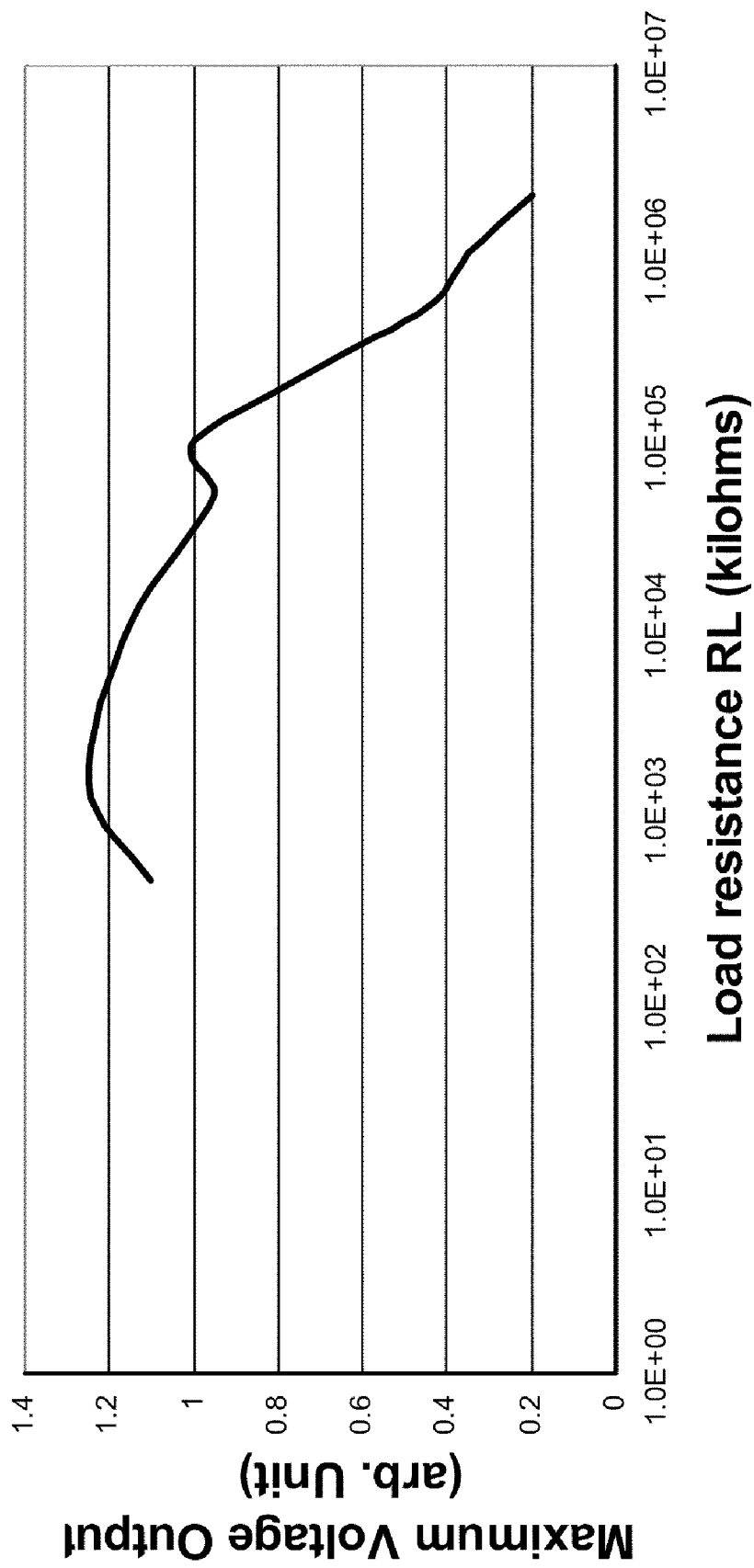
FIG. 22 presents the measured maximum voltage output in arbitrary units as a function of the load resistance, RL in kilohms, for a PLT module measured during heating, illustrating the importance of matching the load resistance for efficient coupling.

FIG. 22 presents the measured maximum voltage output in arbitrary units as a function of the load resistance, RL, for a PLT module measured during heating, illustrating the importance of matching the load resistance for efficient coupling.

Figure 23:
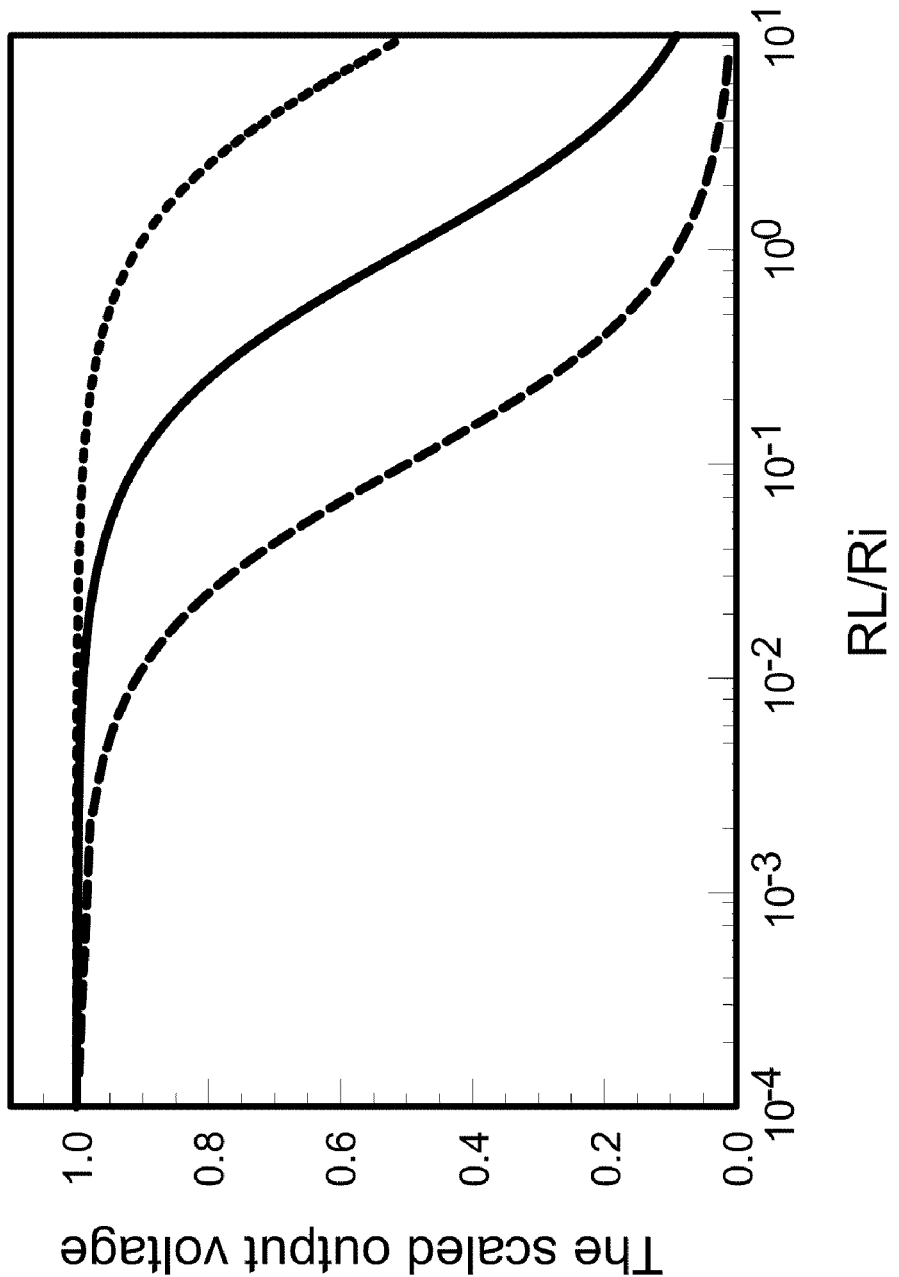
FIG. 23 illustrates the scaled theoretical voltage output for a resistive load as a function of the load resistance ratio x=RL/Ri, where RL is the load resistance and Ri is the internal resistance of the ferroelectric generator in some arbitrary unit; the curves show the results for different values of Ri: Ri=0.1 (lower dashed line), Ri=1.0 (solid line) and Ri=10 (upper dashed line); note that larger Ri is important to obtain larger output power.
Figure 24:
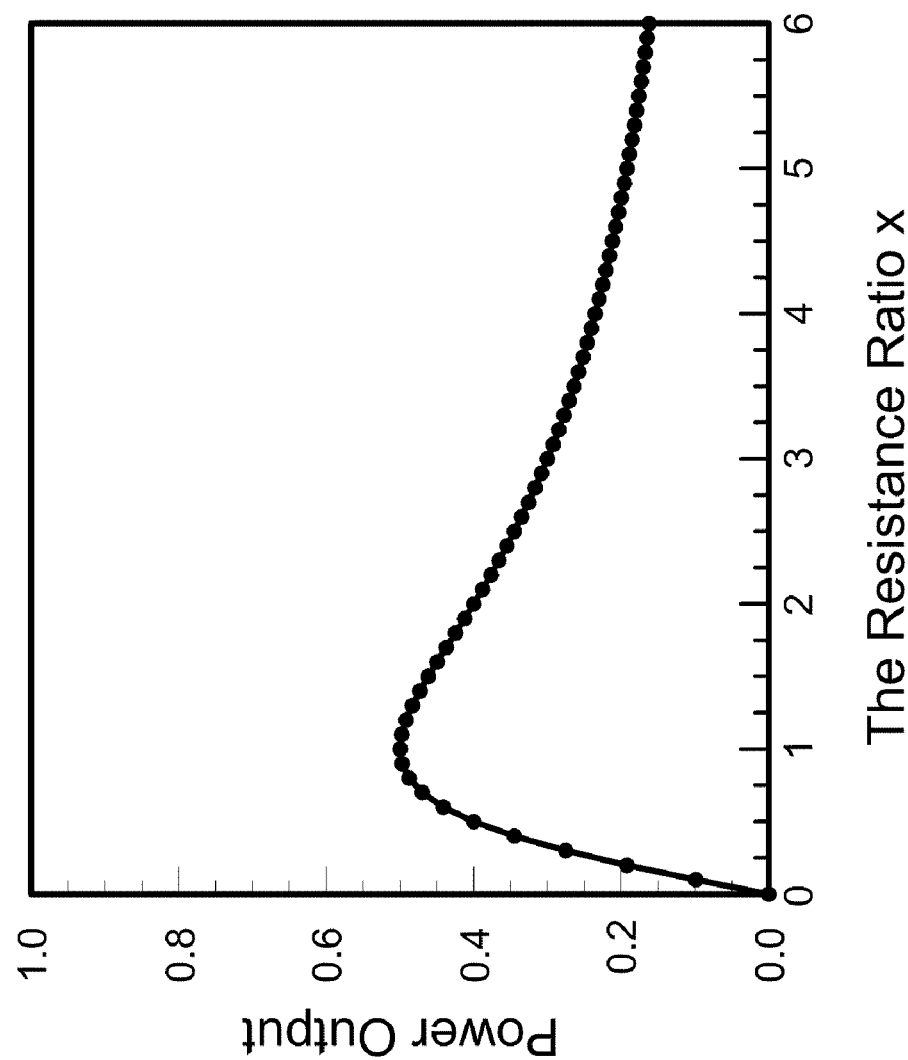
FIG. 24 illustrates the theoretical power output scaled to the maximum available power output as a function of the ratio of load resistance to the internal resistance, x=RL/Ri.

FIG. 23 illustrates the scaled theoretical voltage output for a resistive load as a function of the load resistance ratio x=RL/Ri, where RL is the load resistance and Ri is the internal resistance of the ferroelectric generator in some arbitrary unit. The curves show the results for different values of Ri: Ri=0.1 (lower dashed line), Ri=1.0 (solid line) and Ri=10 (upper dashed line). Note that larger Ri is important to obtain larger output power;

FIG. 24 illustrates the theoretical power output scaled to the maximum available power output as a function of the ratio of load resistance to the internal resistance, x=RL/Ri.

Figure 25:
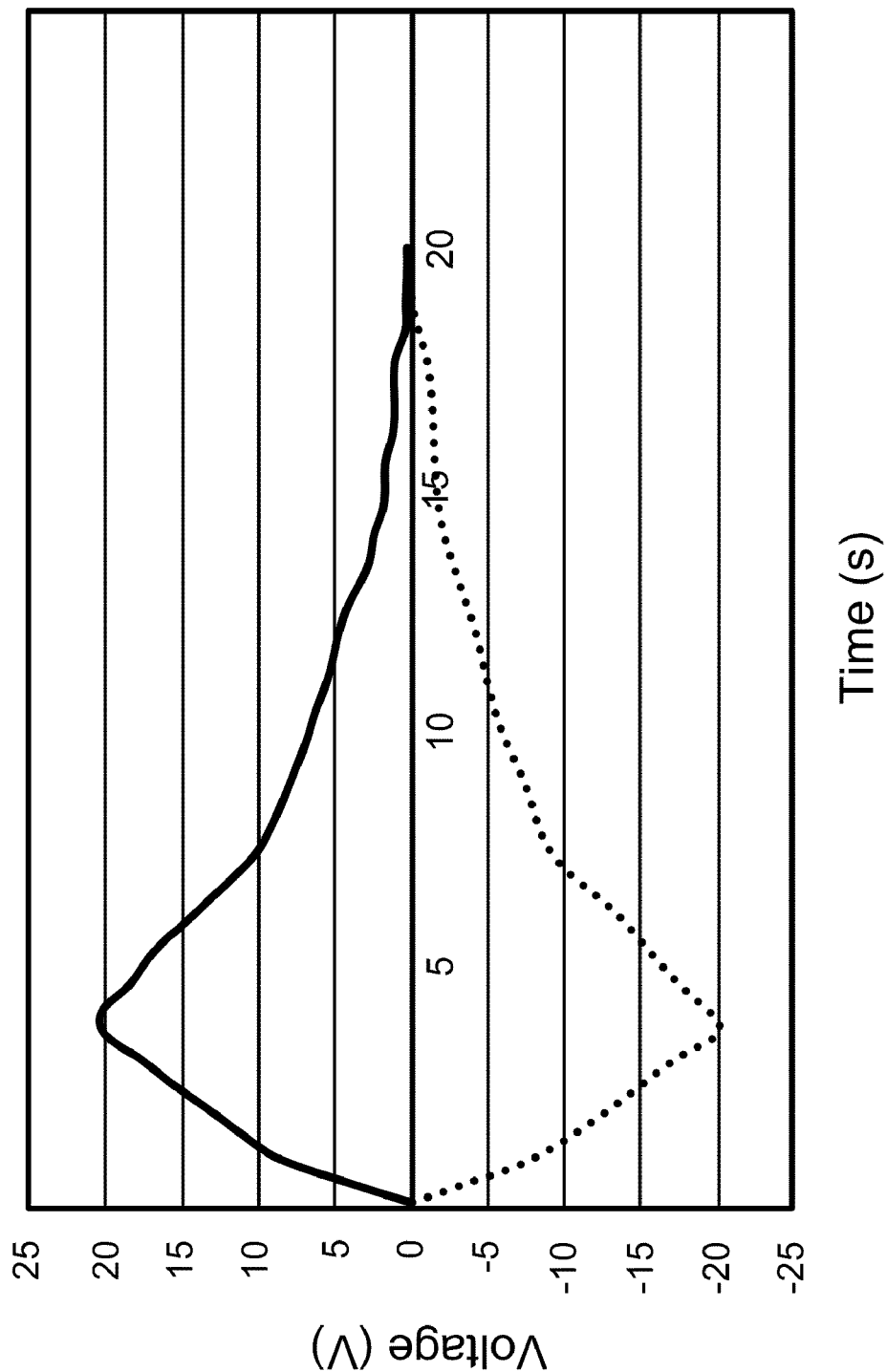
FIG. 25 is the measured voltage over 220 kΩ resistors R1 (dashed line) and R2 (solid line), which are depicted in FIG. 8, due to the switching current during heating of a PZT module with dimensions 1×58×58 mm$^3$; for this current level, voltage drops as high as 6,500V have been obtained across the load resistor RL.
Figure 26A:
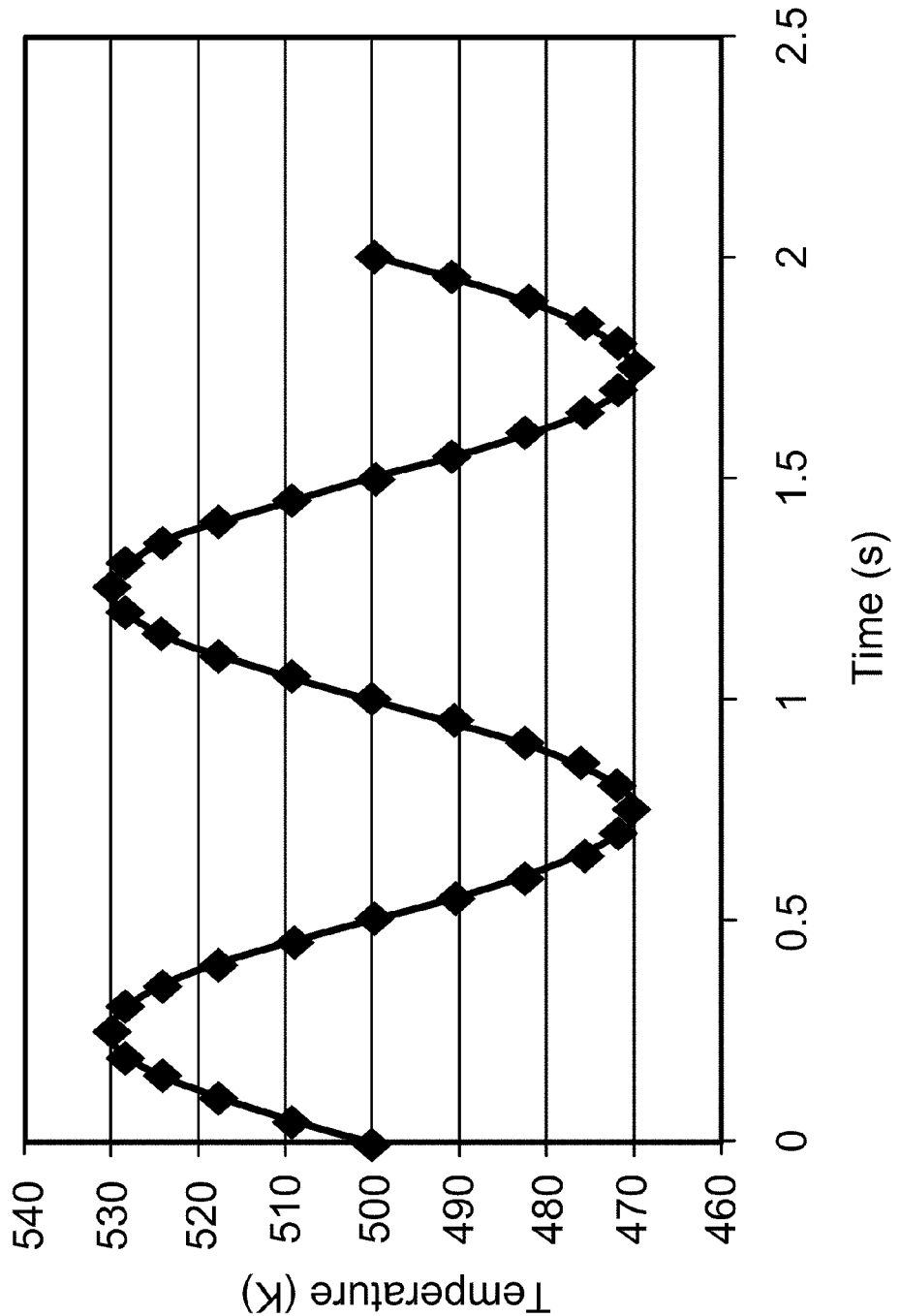
FIG. 26 illustrates the calculated values of certain parameters for a ferroelectric that is thermally cycled in order to utilize the change in spontaneous polarization to generate a large output of electrical energy at high voltage. The graphical output provides the respective values for the indicated parameters over two cycle periods, and electrical energy is withdrawn through the load resistor. The calculated values are based on parameters for a lead based ferroelectric. The several graphs present, as a function of time in seconds: (a) the temperature of the ferroelectric at the lower electrode as depicted in FIG. 1, measured in Kelvin; (b) spontaneous polarization measured in coulombs per $m^2$; (c) the voltage generated across the load resistor; and (d) the power density generated for a resistive load measured in watts per $m^3$ of ferroelectric.
Figure 26B:
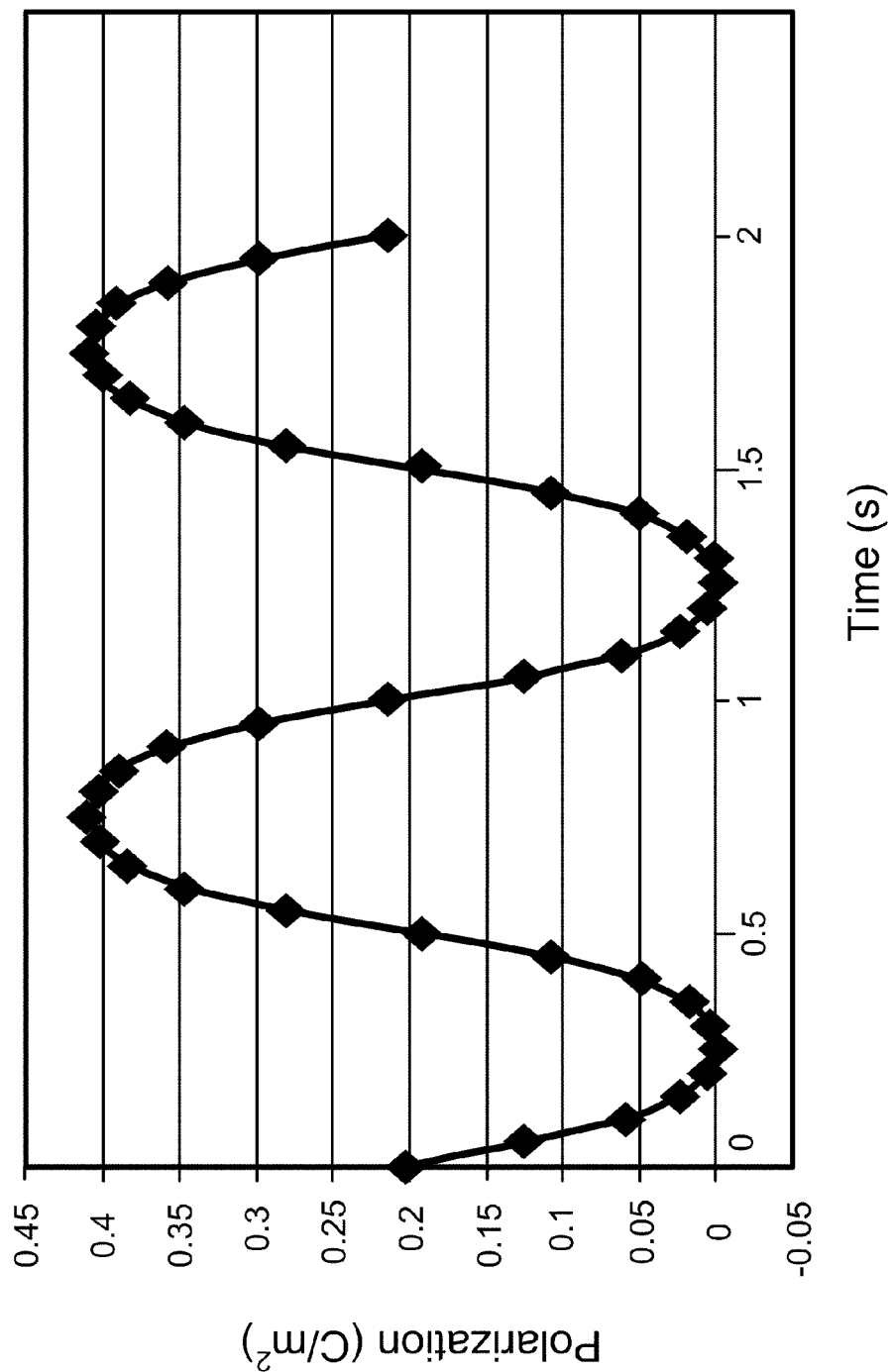
Figure 26C:
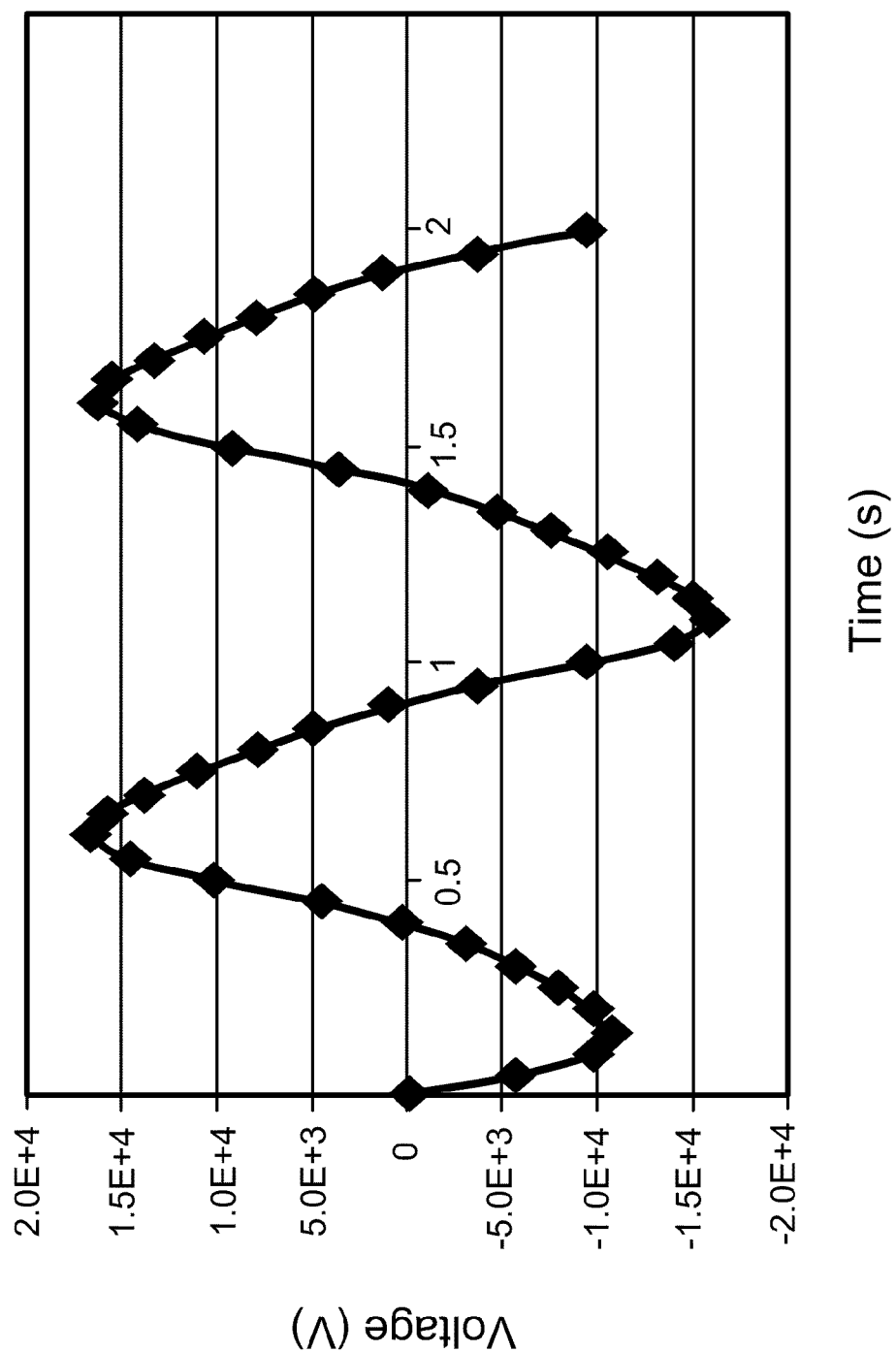
Figure 26D:
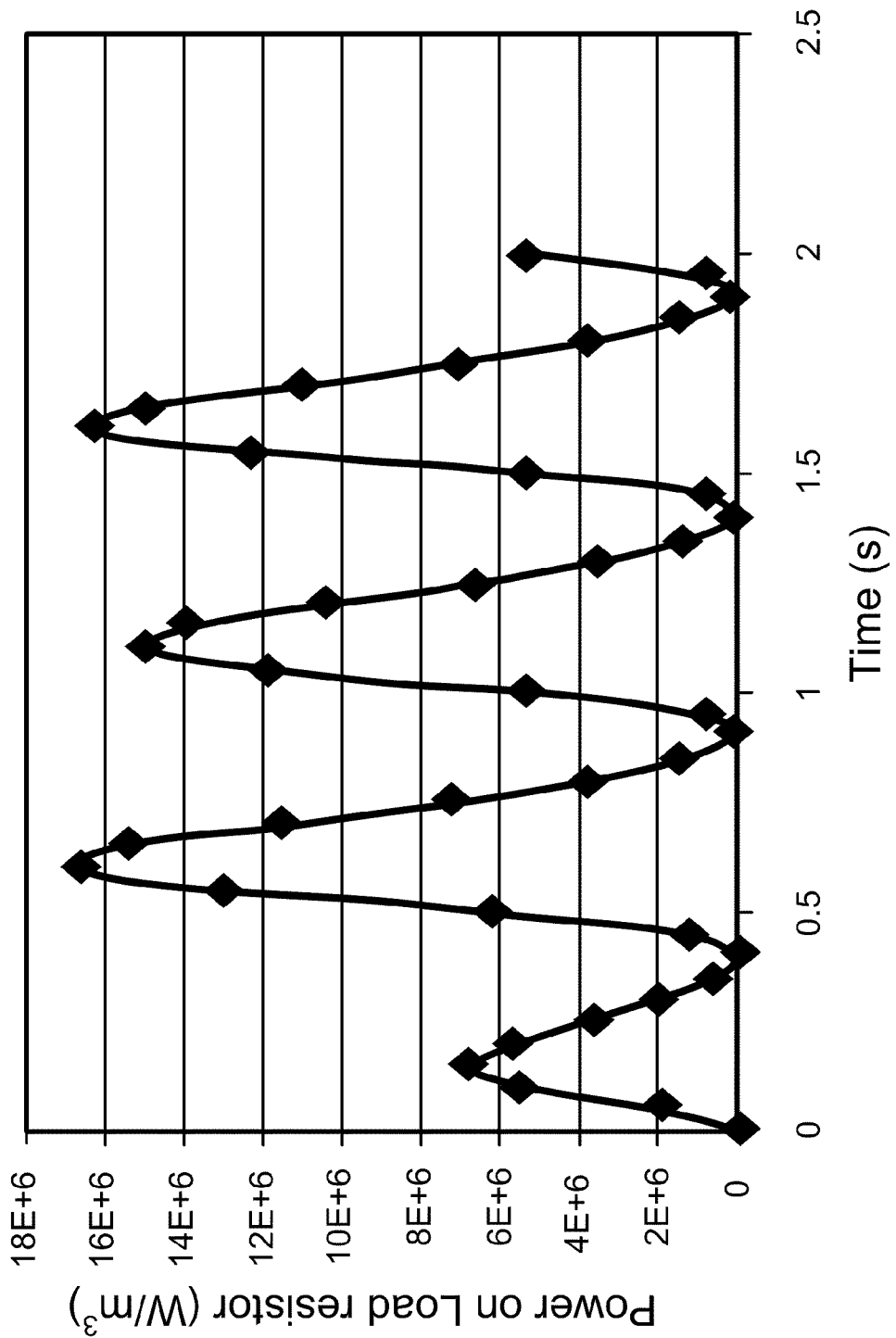

FIG. 25 presents the measured voltage over 220 kΩ resistors, R1 and R2, due to the switching current from a PZT module with dimensions 1×58×58 mm³. The measured voltages over the resistors R1 (dashed line) and R2 (solid line), depicted in FIG. 8, are plotted during heating. For this current level, voltage drops as high as 6,500V have been obtained across the load resistor RL before dielectric breakdown in the PZT module.

FIG. 26 illustrates the calculated values of certain parameters for a ferroelectric module that is thermally cycled in order to utilize the change in spontaneous polarization to generate a large output of electrical energy at high voltage. The graphical output provides the respective values for the indicated parameters over two cycle periods, and electrical energy is withdrawn through the load resistor. The calculated values are based on parameters for a lead based ferroelectric. These graphs present, as a function of time in seconds: (a) the temperature of the ferroelectric at the lower electrode as depicted in FIG. 1, measured in Kelvin; (b) spontaneous polarization measured in coulombs per m²; (c) the voltage generated across the load resistor; and (d) the power density generated for a resistive load measured in watts per m³ of ferroelectric. These values are determined by a numerical finite element analysis that simulates the performance of the device. Note that the simulation assumes the sample is single domain only so that the polarization current is always through the load resistor.

In sum, the present invention, among other things, discloses apparatuses and methods for converting heat to electrical energy and, conversely, using electricity to cool, by using one or more ferroelectric materials that exhibit changes in spontaneous polarization with temperature change. The ferroelectric material is cycled between temperatures above and below the phase transition temperature to utilize the change in spontaneous polarization. The ferroelectric is poled, preferably as it enters the ferroelectric phase. The polar phase is a ferroelectric phase that exists after poling has been done to obtain a large net spontaneous polarization. The non-polar phase is a paraelectric phase or an antiferroelectric phase, both of which lack overall net polarization. In the polar phase, the net spontaneous polarization induces screening charges on electrodes adjacent to the ferroelectric material. Upon transition to the non-polar phase, the unscreened electric charges on the electrodes adjacent to the surface of the ferroelectric are removed into external circuitry at high voltage. Efficient conversion of heat to electric energy is thereby accomplished. While the device may be used with a single such ferroelectric material, more robust conversion of heat to electricity may be achieved in many applications by using a series of ferroelectrics that have a succession of phase transition temperatures that vary across the range of temperatures between the temperatures of the heat source and heat sink for the application. Electrocaloric cooling is achieved by reversing the process.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An apparatus for converting heat to electric energy, comprising:
  (a) a ferroelectric layer having a first surface and an opposite, second surface, wherein the ferroelectric layer is comprised of a ferroelectric material characterized with a phase transition temperature such that, when the material is in a ferroelectric phase spontaneous polarization is established in the unit cells of the ferroelectric, and the ferroelectric layer, upon poling, develops an overall net spontaneous polarization; and such that, as the temperature of the ferroelectric changes so that it traverses the transition temperature, the material enters a paraelectric or antiferroelectric phase wherein the ferroelectric layer has negligible or no overall net spontaneous polarization;
  (b) a pair of electrodes respectively positioned on the first surface and the second surface of the ferroelectric layer, wherein the pair of electrodes is formed of a thermally and electrically conductive material;
  (c) one or more heat exchangers positioned in relation to the ferroelectric layer for alternately removing and inputting heat by convection, conduction, or radiation from and into the ferroelectric layer, so as to alternately cool the ferroelectric layer at a first temperature $T_L$ that is lower than the phase transition temperature, and alternately heat the ferroelectric layer at a second temperature $T_H$ that is higher than the phase transition temperature, so that the ferroelectric material of the ferroelectric layer thereby undergoes alternating phase transitions between the ferroelectric phase and the paraelectric or antiferroelectric phase;
  (d) a voltage source positioned in relation to the ferroelectric layer and the pair of electrodes for applying a DC voltage and a resulting electric field for poling the ferroelectric layer in, or during the transition to, the ferroelectric phase, an external field not otherwise being applied to the ferroelectric layer, wherein the ferroelectric layer, the pair of electrodes, and the one or more heat exchangers are configured such that when the ferroelectric material of the ferroelectric layer is in the ferroelectric phase, electrically-opposite screening charges are respectively generated on the pair of electrodes, and when the ferroelectric material of the ferroelectric layer transitions into the paraelectric or antiferroelectric phase, the generated electrically-opposite screening charges on the pair of electrodes are discharged therefrom as electric energy; and (e) a control circuit connecting the pair of electrodes to a load while the one or more heat exchangers are heating or cooling the ferroelectric material such that the generated screening charges on the pair of electrodes are discharged therefrom as electrical energy during the transition of the ferroelectric material from the ferroelectric phase to the paraelectric or antiferroelectric phase.

2. An apparatus for converting heat to electric energy, comprising:

(a) a ferroelectric layer having a first surface and an opposite, second surface, wherein the ferroelectric layer is formed of a ferroelectric material characterized with a Curie temperature, $T_c$, such that when the temperature of the ferroelectric material is lower than the Curie temperature, $T_c$, the ferroelectric material is in a ferroelectric phase in which spontaneous polarization is established in the unit cells of the ferroelectric material, and the ferroelectric layer, upon poling, develops an overall net spontaneous polarization; and when the temperature of the ferroelectric material is greater than the Curie temperature, $T_c$, spontaneous polarization is not established in the unit cells of the ferroelectric material;

(b) a pair of electrodes respectively on the first surface and the second surface of the ferroelectric layer, wherein the electrodes are formed of a thermally and electrically conductive material;

(c) a delivering means positioned in relation to the ferroelectric layer for alternately delivering a flow of cold fluid and a flow of hot fluid so as to alternately cool the ferroelectric layer at a first temperature $T_L$ that is lower than the Curie temperature $T_c$ and heat the ferroelectric layer at a second temperature $T_H$ that is higher than the Curie temperature $T_c$, so that the ferroelectric material of the ferroelectric layer thereby undergoes alternating phase transitions between the ferroelectric phase and the paraelectric phase with temperature cycling, wherein the ferroelectric layer, the pair of electrodes and the delivering means are configured such that when the ferroelectric material of the ferroelectric layer is in the ferroelectric phase, electrically-opposite screening charges are respectively generated on the pair of electrodes, and when the ferroelectric material of the ferroelectric layer transitions to the paraelectric phase, the generated electrically-opposite screening charges on the pair of electrodes are discharged therefrom as electric energy; and (d) a control circuit connecting the pair of electrodes to a load while the delivering means is heating or cooling the ferroelectric material such that the generated screening charges on the pair of electrodes are discharged therefrom as electrical energy during the transition of the material from the ferroelectric phase to the paraelectric phase.

3. The apparatus of claim 2, further comprising a pair of electric leads electrically connected to the pair of electrodes, such that when the ferroelectric material of the ferroelectric layer is in, or entering into, the ferroelectric phase, a DC voltage is applied between the pair of electric leads to pole the spontaneous polarization of the unit cells of the ferroelectric material so that the electrically-opposite screening charges are respectively generated on the pair of electrodes; and when the ferroelectric material of the ferroelectric layer is in, or entering into, the paraelectric phase, the electric energy corresponding to the generated electrically-opposite screening charges is output to the pair of electric leads at a voltage that is much higher than the applied DC poling voltage.

4. The apparatus of claim 2, wherein the delivering means comprises one or more heat exchangers in fluid communication with a heat source and a heat sink for, respectively, inputting heat from the heat source to the ferroelectric layer so as to heat the ferroelectric layer at the second temperature $T_H$, and withdrawing heat from the ferroelectric layer to the heat sink so as to cool the ferroelectric layer at the first temperature $T_L$.

5. The apparatus of claim 2, wherein the delivering means comprises:

(a) a first fluid passage and a second fluid passage formed on the pair of electrodes, respectively, such that when a flow of cold fluid passes through at least one of the first and second fluid passages, the ferroelectric layer is cooled towards the first temperature $T_L$, and when a flow of hot fluid passes through at least one of the first and second fluid passages, the ferroelectric layer is heated towards the second temperature $T_H$;

(b) one or more heat exchangers positioned such that the first and second fluid passages alternately deliver a flow of cold fluid and a flow of hot fluid so as to alternately cool the ferroelectric layer at a first temperature $T_L$ and heat the ferroelectric layer at a second temperature $T_H$; and (c) a plurality of control valves in communication with the one or more heat exchangers for controlling the flow of cold and hot fluids.

6. The apparatus of claim 5, wherein the plurality of control valves is controlled by one or more microcontrollers.

7. The apparatus of claim 2, further comprising means for monitoring one or more of the temperature of the ferroelectric layer, the temperatures of the heating or cooling fluids, or the capacitance of the ferroelectric layer.

8. An apparatus for converting heat to electric energy, comprising:

(a) a plurality of ferroelectric modules, $\{FM^n\}$, arranged in a stack, n = 1, 2, 3, ... N, N being an integer greater than one, each ferroelectric module $FM^n$ comprising:

a ferroelectric layer having a first surface and an opposite, second surface, wherein the ferroelectric layer is formed of a ferroelectric material characterized with a phase transition temperature, $T^n$, such that when the ferroelectric material is in a ferroelectric phase, spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization, wherein different ferroelectric layers of the plurality of ferroelectric modules $\{FM^n\}$ are formed of an identical ferroelectric material or different ferroelectric materials with respective transition temperatures $T^n$; and (b) a first electrode and a second electrode positioned on the first surface and the second surface of the ferroelectric stack, wherein the electrodes are formed of a thermally and electrically conductive material;

(c) one or more heat exchangers positioned in relation to the stacked ferroelectric modules {FM″} for alternately removing and inputting heat by convection, conduction or radiation from and into the stacked ferroelectric modules {FM″} so as to alternately cool the stacked ferroelectric modules {FM″} so that the temperature of each n-th layer is lower than its respective transition temperature, T″, and alternately heat the stacked ferroelectric modules {FM″} so that the temperature of each n-th layer is higher than its respective transition temperature, T″, such that each ferroelectric layer of the stacked ferroelectric modules {FM″} thereby undergoes alternating phase transitions between (1) the ferroelectric phase and (2) the paraelectric or antiferroelectric phase, with temperature cycling;

(d) a voltage source positioned in relation to the stacked ferroelectric modules {FM″} so that, when the ferroelectric layers of the stacked ferroelectric modules {FM″} are in the ferroelectric phase or transitioning into the ferroelectric phase, a DC voltage and a resulting electric field are applied to the ferroelectric layers of the stacked ferroelectric modules {FM″} to pole the ferroelectric layers so that screening charges are generated on the electrodes; and (e) a control circuit connecting the first and second electrodes to a load while the one or more heat exchangers are heating or cooling the ferroelectric material of the ferroelectric layers of the stacked ferroelectric modules {FM″} such that the generated screening charges on the first and second electrodes are discharged therefrom as electric energy during the transition of the ferroelectric materials from the ferroelectric phase to the paraelectric or antiferroelectric phase.

9. The apparatus of claim 8, wherein each two adjacent ferroelectric layers are separated by electrodes formed of a thermally and electrically conductive material.

10. The apparatus of claim 8, wherein each two adjacent ferroelectric layers are separated by two electrodes formed of a thermally and electrically conductive material, and each such two electrodes that separate two adjacent ferroelectric layers are in turn separated by an electrical insulator.

* * * * *